United States Patent
Oooka et al.

(10) Patent No.: US 11,723,258 B2
(45) Date of Patent: Aug. 8, 2023

(54) PHOTOELECTRIC CONVERSION MATERIAL DISPERSION LIQUID AND PRODUCING METHOD THEREOF, PRODUCING METHOD AND PRODUCING APPARATUS OF PHOTOELECTRIC CONVERSION FILM, AND PHOTOELECTRIC CONVERSION DEVICE

(71) Applicant: Kabushiki Kaisha Toshiba, Minato-ku (JP)

(72) Inventors: Haruhi Oooka, Kawasaki (JP); Hideyuki Nakao, Setagaya (JP); Mitsunaga Saito, Inzai (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 334 days.

(21) Appl. No.: 16/814,049

(22) Filed: Mar. 10, 2020

(65) Prior Publication Data
US 2020/0212302 A1 Jul. 2, 2020

Related U.S. Application Data

(62) Division of application No. 15/251,588, filed on Aug. 30, 2016, now abandoned.

(30) Foreign Application Priority Data

Sep. 16, 2015 (JP) ................... 2015-182450

(51) Int. Cl.
*H10K 71/15* (2023.01)
*H01L 31/0256* (2006.01)
(Continued)

(52) U.S. Cl.
CPC ......... *H10K 71/15* (2023.02); *H01L 31/0256* (2013.01); *H01L 31/18* (2013.01);
(Continued)

(58) Field of Classification Search
None
See application file for complete search history.

(56) References Cited

U.S. PATENT DOCUMENTS

| 5,871,579 A | 2/1999 | Liang et al. |
| 6,344,662 B1 | 2/2002 | Dimitrakopoulos et al. |
| (Continued) | | |

FOREIGN PATENT DOCUMENTS

| CN | 103440988 A | 12/2013 |
| CN | 104733618 A | 6/2015 |
| (Continued) | | |

OTHER PUBLICATIONS

Niu et al. (Review of recent progress in chemical stability of perovskite solar cells, J. Mater. Chem. A, First Published Dec. 3, 2014; 3, 8970-8980; Niu). (Year: 2014).*

(Continued)

*Primary Examiner* — Francisco W Tschen
(74) *Attorney, Agent, or Firm* — Oblon, McClelland, Maier & Neustadt, L.L.P.

(57) ABSTRACT

A photoelectric conversion material dispersion liquid of an embodiment includes: perovskite crystal particles having a composition represented as $ABX_3$, where A is a monovalent cation of an amine compound, B is a divalent cation of a metal element, and X is a monovalent anion of a halogen element, and having an average particle diameter of not less than 10 nm nor more than 10000 nm; and a dispersion medium which is composed of a poor solvent to the perovskite crystal particles, and in which the perovskite crystal particles are dispersed.

13 Claims, 9 Drawing Sheets

(51) Int. Cl.
  *H01L 31/18* (2006.01)
  *H10K 30/20* (2023.01)
  *H10K 85/30* (2023.01)
  *H10K 85/20* (2023.01)
  *H10K 85/10* (2023.01)
  *H10K 102/10* (2023.01)

(52) U.S. Cl.
  CPC .......... *H01L 31/186* (2013.01); *H10K 30/211* (2023.02); *H10K 85/1135* (2023.02); *H10K 85/215* (2023.02); *H10K 85/30* (2023.02); *H10K 2102/103* (2023.02); *Y02E 10/549* (2013.01); *Y02P 70/50* (2015.11)

(56) References Cited

U.S. PATENT DOCUMENTS

| | | | |
|---|---|---|---|
| 9,391,287 B1 | 7/2016 | Huang | |
| 2003/0127129 A1* | 7/2003 | Yoshikawa | C07D 213/76 429/111 |
| 2008/0146776 A1 | 6/2008 | Liu | |
| 2012/0234389 A1 | 9/2012 | Oooka et al. | |
| 2014/0174524 A1 | 6/2014 | Obana | |
| 2014/0332078 A1 | 11/2014 | Guo et al. | |

FOREIGN PATENT DOCUMENTS

| | | |
|---|---|---|
| JP | 63-85433 | 4/1988 |
| JP | 64-80843 | 3/1989 |
| JP | 5-323679 | 12/1993 |
| JP | 2000-112186 A | 4/2000 |
| JP | 2002-198539 | 7/2002 |
| JP | 2004-67883 A | 3/2004 |
| JP | 2004-358351 A | 12/2004 |
| JP | 2005-275316 A | 10/2005 |
| JP | 2007-5177 A | 1/2007 |
| JP | 2008-227330 | 9/2008 |
| JP | 2008-537599 | 9/2008 |
| JP | 2010-234218 A | 10/2010 |
| JP | 2011-51911 A | 3/2011 |
| JP | 2012-195516 A | 10/2012 |
| JP | 2015-76557 A | 4/2015 |
| JP | 2015-520149 A | 7/2015 |
| WO | WO 2007/094778 A2 | 8/2007 |
| WO | WO 2013/169647 A1 | 11/2013 |
| WO | WO 2014/042449 A2 | 3/2014 |
| WO | WO 2014/045021 A1 | 3/2014 |
| WO | WO 2014/151522 A1 | 9/2014 |

OTHER PUBLICATIONS

Yongzhen Wu, et al., "Consecutive Morphology Controlling Operations for Highly Reproducible Mesostructured Perovskite Solar Cells" ACS Applied Materials and Interfaces, vol. 7, No. 37, 2015, pp. 20707-20713.

Jeannette M. Kadro, et al., "Facile route to freestanding $CH_3NH_3PbI_3$ crystals using inverse solubility," Scientific Reports, vol. 5, Article No. 11654, Jun. 30, 2015, 6 pages.

Junyan Xiao, et al., "Pressure-assisted $CH_3NH_3PbI_3$ morphology reconstruction to improve the high performance of perovskite solar cells", Journal of Materials Chemistry A, Mar. 2015, pp. 5289-5293.

Zheng, X. et al. "Room temperature fabrication of $CH_3NH_3PbBr_3$ by anti-solvent assisted crystallization approach for perovskite solar cells with fast response and small J-V hysteresis" ScienceDirect, Nano Energy, vol. 17, 2015, pp. 269-278.

Manabu Matsuri et al., "Research on visualization and quantification of moisture behavior in cracked concrete by neutron radiography", Application of Neutron Radiography in the Field of Concrete Engineering, vol. 29, 2007 (w/English translation).

M. Kanematsu et al., "Quantification of water penetration into concrete through cracks by neutron radiography", Nuclear Instruments and Methods in Physics Research, 2009, 154-158.

Office Action dated Feb. 4, 2020 in Japanese Application No. 2019-022703 (w/English translation).

* cited by examiner

PHOTOELECTRIC CONVERSION MATERIAL DISPERSION LIQUID AND PRODUCING METHOD THEREOF, PRODUCING METHOD AND PRODUCING APPARATUS OF PHOTOELECTRIC CONVERSION FILM, AND PHOTOELECTRIC CONVERSION DEVICE

CROSS REFERENCE TO RELATED APPLICATION

This application is a division of and claims the benefit of priority under 35 U.S.C. § 120 from U.S. application Ser. No. 15/251,588 filed Aug. 30, 2016, and claims the benefit of priority under 35 U.S.C. § 119 from Japanese Patent Application No. 2015-182450 filed Sep. 16, 2015; the entire contents of each of which are incorporated herein by reference.

FIELD

Embodiments disclosed herein generally relate to a photoelectric conversion material dispersion liquid and a producing method thereof, a producing method and a producing apparatus of a photoelectric conversion film, and a photoelectric conversion device.

BACKGROUND

Photoelectric conversion devices such as photovoltaics, a photosensor, a light emitting element, a photodiode, and an optical memory, which use perovskite-type materials as a photoelectric conversion material, are expected as a low-cost photoelectric conversion device because an inexpensive coating method is applicable to layer formation. Among the perovskite-type materials used as the photoelectric conversion material, a perovskite crystal having a composition represented as $ABX_3$ and having a three-dimensional crystal structure is excellent in power conversion efficiency, and therefore photovoltaics in which the perovskite crystal is used to improve conversion efficiency are reported. As one of the problems of such photovoltaics, area enlargement can be cited. In the photovoltaics using the perovskite crystal, in the case of a device area of about 0.1 $cm^2$, the conversion efficiency of about 20% is reported, but the report in which in the case of the device area of 1 $cm^2$, the conversion efficiency is about 15% and in the case of the device area of 100 $cm^2$, the conversion efficiency is about 5% is only made. As one of the reasons of the above, the point that a conventional perovskite-layer forming technique fails to form a uniform and high quality perovskite crystal layer so as to have a large area can be cited.

As a conventional forming method of the perovskite crystal layer, there has been known a method in which what is called a good solvent enabling dissolution of perovskite crystals is used to form a solution, this solution is applied on a film forming object, and then constituents of the dissolved perovskite crystals are made to crystallize (precipitate) on the film forming object. In such a forming method, film properties of the perovskite crystal layer are affected by a large number of factors and are liable to be affected by them, resulting in difficulty in forming a uniform and high quality perovskite crystal layer so as to have a large area. The film properties mean morphology, sizes and shapes of crystals, lattice defects, dislocation, and orientation displacement of crystals, impurities, coverage, film thickness, and the like. As the affecting factors, there can be cited drying conditions, solvent types, additives, impurities, solid content concentration, and temperature of the perovskite crystal solution, and further material, temperature, impurities, irregularities, and so on of the film forming object surface, for example. When a film is formed so as to have a large area, for example, the drying conditions are likely to be nonuniform, so that the film properties are also likely to be nonuniform.

As a forming method of a film using a perovskite crystal material having a composition represented as $A_2BX_4$ and having a two-dimensional layer structure, there has been proposed a method in which such a material is dissolved in a good solvent to form a solution, and using this solution, a film is formed by a spin coating method or the like. Regarding the perovskite crystal material having a two-dimensional layer structure, it has been also considered that particles of this material are dispersed in a solvent together with a polymer to be an organic matrix to form a dispersion liquid, and using this dispersion liquid, a film is formed by a spin coating method or the like. By dispersing the perovskite crystal particles in the organic matrix, dispersibility of the particles in a photoelectric conversion film such as a light emitting layer improves, but the relative amount of the perovskite crystal particles in the photoelectric conversion film decreases due to existence of the organic matrix. Further, only the above fails to achieve practical area enlargement of the photoelectric conversion device such as a light emitting element or photovoltaics.

For example, cells forming a photovoltaic module using a transparent electrode each have a structure in which a photoelectric conversion film (power generation layer) is sandwiched by a transparent electrode and a counter electrode. At present, a transparent electrode on a practical level does not have sufficient conductivity, and accordingly efficiency for extracting generated charges deteriorates as a cell area is increased. Thus, generally, a plurality of strip-shaped cells are arranged and formed and the plural cells are connected in series. In order to fabricate such a photovoltaic module at low cost, pattern film forming of forming materials of the perovskite crystal layer is required to be performed precisely according to a cell pattern. Further, the appropriate film thickness of the perovskite crystal layer is about 10 nm to 1000 nm, so that such an extremely thin layer is required to be formed precisely. However, there is a problem that the conventional film forming technique fails to pattern film form the perovskite crystal layer precisely at low cost.

Although in a general photovoltaic module, pattern film forming of a simple shape such as a strip shape is required, in the case of a photovoltaic module intended for solar wrist watch, pattern film forming of a triangle or a sector is required. Further, in the case of a photoelectric conversion device such as a display or a photosensor, fine pattern film forming is needed. When such pattern film forming of irregular shapes and fine pattern film forming are required, it becomes further difficult to pattern film form the perovskite crystal layer precisely at low cost in the conventional film forming technique.

DETAILED DESCRIPTION

According to one embodiment, there is provided a photoelectric conversion material dispersion liquid including: perovskite crystal particles having a composition represented by a composition formula: $ABX_3$, wherein A is a monovalent cation of an amine compound, B is a divalent cation of a metal element, and X is a monovalent anion of a halogen element, and having an average particle diameter of 10 nm or more and 10000 nm or less; and a dispersion medium which is composed of a poor solvent to the perovskite crystal particles, and in which the perovskite crystal particles are dispersed.

According to another embodiment, there is provided a producing method of a photoelectric conversion film including: forming a film containing perovskite crystal particles by causing the photoelectric conversion material dispersion liquid of the embodiment to adhere on a film forming object. According to still another embodiment, there is provided a producing apparatus of a photoelectric conversion film including: a film forming mechanism which causes the photoelectric conversion material dispersion liquid of the embodiment to adhere on a film forming object.

Hereinafter, there will be explained a photoelectric conversion material dispersion liquid of an embodiment and a producing method thereof, a producing method and a producing apparatus of a photoelectric conversion film, and a photoelectric conversion device with reference to the drawings. Note that, in each embodiment, substantially the same constituent parts are denoted by the same reference signs and an explanation thereof will be partly omitted in some case. The drawings are schematic, and a relation of thickness and planar dimension, a thickness ratio among parts, and so on are sometimes different from actual ones. Terms indicating up and down directions and so on in the explanation indicate relative directions when a film forming surface of a later-described film forming object is defined as an up direction, unless otherwise noted, and they are sometimes different from actual directions based on a gravitational acceleration direction.

[Photoelectric Conversion Material Dispersion Liquid and Producing Method Thereof]

Figure 1:
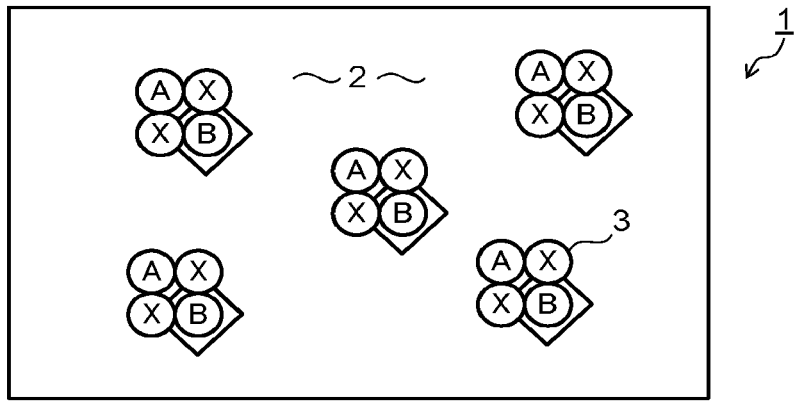
FIG. 1 is a view schematically illustrating a state of a photoelectric conversion material dispersion liquid of an embodiment.

FIG. 1 is a view schematically illustrating a state of a photoelectric conversion material dispersion liquid of an embodiment. A photoelectric conversion material dispersion liquid 1 illustrated in FIG. 1 includes a dispersion medium 2, and perovskite crystal particles 3 dispersed in the dispersion medium 2. The perovskite crystal particles 3 have a composition represented by the following formula (1) and have a three-dimensional crystal structure.

$$\text{Composition formula: } ABX_3 \quad (1)$$

In the formula (1), A is a monovalent cation of an amine compound, B is a divalent cation of a metal element, and X is a monovalent anion of a halogen element.

The perovskite-type crystal structure is classified into four types of zero-dimensional structure to three-dimensional structure. The two-dimensional structure having a composition represented as $A_2BX_4$ and the three-dimensional structure having a composition represented as $ABX_3$ are advantageous for obtaining a high-efficiency photoelectric conversion material and a photoelectric conversion device using it. Between the both, the three-dimensional structure has been known that a bound energy of an exciton is low, which is more preferable for obtaining the high-efficiency photoelectric conversion material and the photoelectric conversion device. It has been known to take the two-dimensional structure when an ion radius of an A site is large and to take the three-dimensional structure when it is small.

It has been known empirically that when A-site ions have an ion radius having a tolerance factor t falling within a range of 0.75 to 1.1, a perovskite-type crystal having a three-dimensional structure is formed. The tolerance factor t is a value expressed by the following expression (2). The ion radius includes various types, and the ion radius defined by Shannon is used.

$$t = (A\text{-site ion radius} + X\text{-site ion radius}) / \{2^{1/2} \times (B\text{-site ion radius} + X\text{-site ion radius})\} \quad (2)$$

For the purpose of satisfying such an A-site ion condition as described above, the A site is formed of monovalent cations of an amine compound. The amine compound forming the A site is preferable to be at least one selected from methylammonium ($CH_3NH_2$) and formamidinium ($NH_2CHNH$). Further, the B site is formed of divalent cations of a metal element, and the X site is formed of monovalent anions of a halogen element. The metal element forming the B site is preferable to be at least one selected from lead (Pb) and tin (Sn). The halogen element forming the X site is preferable to be at least one selected from iodine (I), bromine (Br), and chlorine (Cl). With these, high power conversion efficiency is obtained.

The perovskite crystal particles 3 have an average particle diameter falling within a range of 10 to 10000 nm. When the average particle diameter of the perovskite crystal particles 3 is less than 10 nm, the particles become likely to aggregate, and uniform dispersion in the dispersion medium 2 becomes difficult. When the average particle diameter of the perovskite crystal particles 3 exceeds 10000 nm, the perovskite crystal particles 3 become likely to settle out in the dispersion medium 2, and uniform dispersion in the dispersion medium 2 becomes difficult. The average particle diameter of the perovskite crystal particles 3 is more preferable to be 20 nm or more, and is further desirable to be 30 nm or more. The average particle diameter of the perovskite crystal particles 3 is more preferable to be 1000 nm or less, and is further desirable to be 300 nm or less. The average particle diameter of the perovskite crystal particles 3 indicates a value obtained by measuring the perovskite crystal particles 3 using a laser diffraction/scattering particle size distribution measuring device.

Further, the average particle diameter of the perovskite crystal particles 3 may be adjusted according to use applications of a perovskite crystal layer (photoelectric conversion film) formed by using the dispersion liquid 1. The appropriate average particle diameter of the perovskite crystal particles 3 differs between the case of application to a photoelectric conversion device like photovoltaics in which a current is important and the case of application to a photoelectric conversion device like a photodiode in which change of voltage only has to occur, for example. In the former case, the film thickness of the perovskite crystal layer is preferable to be 10 to 1000 nm. When it becomes thicker than this, current extraction becomes difficult. In the latter case, it is acceptable even if it becomes thicker than this. When the perovskite crystal particles 3 having an average particle diameter of 1000 nm are used in forming the perovskite crystal layer having a film thickness of 1000 nm by using the dispersion liquid 1, a film with a low filling factor is formed. In such a case, by using the perovskite crystal particles 3 having an average particle diameter of 300 nm or less, a plurality of crystal particle layers are formed to be subjected to a later-described packing process, and thereby it is possible to form a perovskite crystal layer that has a high filling factor, a smooth surface, and a film thickness of 1000 nm.

In the photoelectric conversion material dispersion liquid 1 of the embodiment, the concentration of the perovskite crystal particles 3 in the dispersion liquid 1 preferably falls within a range of 0.1 to 40 vol %. When the concentration of the perovskite crystal particles 3 is too low, in a later-described drying step of the dispersion medium 2, a drying time is prolonged, or energy required for drying increases. However, when the concentration of the perovskite crystal particles 3 is too high, particle aggregation and the like become likely to occur.

As the dispersion medium 2 that disperses the above-described perovskite crystal particles 3, a poor solvent of perovskite crystal is used. Here, the poor solvent is a solvent in which the perovskite crystal is not dissolved substantially, and is a solvent in which the perovskite crystal is not dissolved substantially under the environments of solid content concentration, temperature, pressure, and the like in the film forming process of the perovskite crystal layer. It is possible to say that the perovskite crystal is not dissolved substantially when cloudiness is recognized in a solution mixed with the perovskite crystal particles and the poor solvent in visual observation. Concrete examples of the poor solvent of perovskite crystal includes an aliphatic hydrocarbon solvent having six or more carbons of hexane, heptane, dodecane, or the like, an alicyclic hydrocarbon solvent having five or more carbons of cyclopentane, cyclohexane, or the like, a halogenated hydrocarbon solvent having four or more carbons of chlorinated alkane, fluorinated alkane, chlorinated and fluorinated alkane, or the like, silicone oil, and a mixture of these. Here, insulating liquids are described as an example, but the poor solvent may be a conductive liquid.

Figure 2:
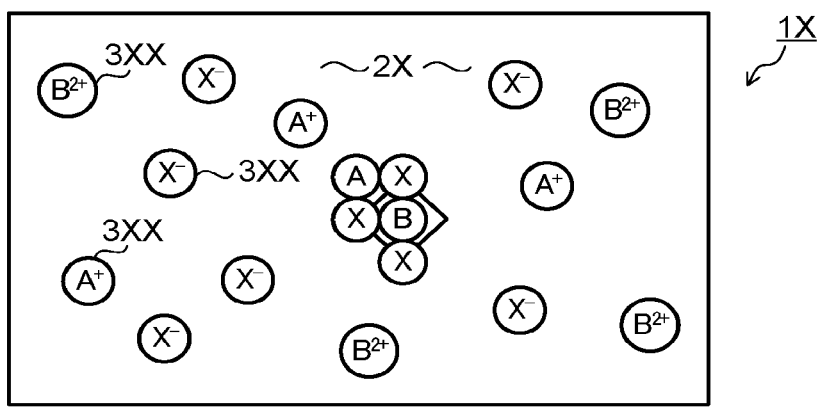
FIG. 2 is a view schematically illustrating a state of a forming solution of a conventional photoelectric conversion film.

When the perovskite crystal particles 3 are dispersed in the dispersion medium 2, which is the poor solvent of perovskite crystal, the perovskite crystal particles 3 are not dissolved substantially in the dispersion medium 2, so that as illustrated in FIG. 1, the perovskite crystal particles 3 exist in the dispersion medium 2 in a perovskite crystal particle 3 state. Thus, in the producing step of the photoelectric conversion film using the dispersion liquid 1, a uniform and high quality perovskite crystal layer can be film formed so as to have a large area, as will be described in detail later. In the meantime, as illustrated in FIG. 2, in a solution 1X obtained by dissolving the perovskite crystal material in a good solvent of perovskite crystal, component ions 3XX of the perovskite crystal material exist in a dispersion medium 2X, some of which exist as microcrystalline particles, gel, or the like of the perovskite crystal. The solution is caused to crystallize on the film forming object from such a state to form the perovskite crystal layer, thus being affected by a large number of factors. Accordingly, it is difficult to form a uniform and high quality perovskite crystal layer so as to have a large area, as will be described in detail later.

Figure 3:
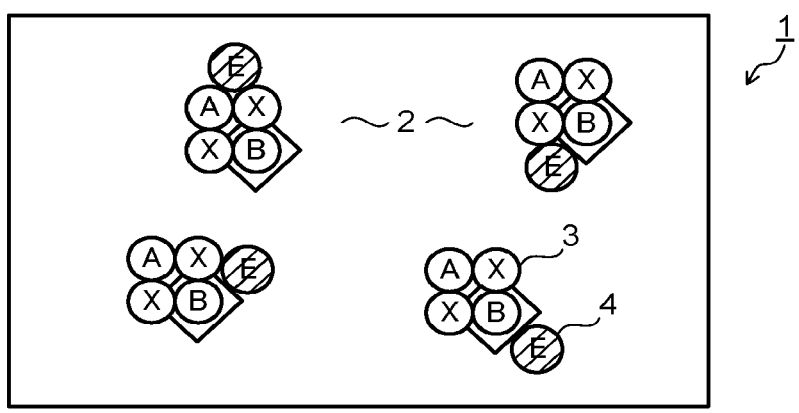
FIG. 3 is a view schematically illustrating a modified example of the photoelectric conversion material dispersion liquid illustrated in FIG. 1.

The photoelectric conversion material dispersion liquid 1 may contain a charge imparting agent 4 as illustrated in FIG. 3. When the charge imparting agent 4 is added into the dispersion medium 2, the charge imparting agent 4 adheres to the perovskite crystal particles 3, so that it is possible to more securely charge the perovskite crystal particles 3. Charging the perovskite crystal particles 3 makes it easier for the perovskite crystal particles 3 to migrate in the dispersion medium 2 with use of electric field power and to adhere to the film forming object, and makes it difficult for the perovskite crystal particles 3 to aggregate in the dispersion medium 2. It is possible to make the perovskite crystal particles 3 migrate due to an effect of impurity, a dielectric phenomenon of the perovskite crystal particles 3, or the like without addition of the charge imparting agent 4, but by adding the charge imparting agent 4, properties can be further improved.

As the charge imparting agent 4, metal organic acid salt, lecithin, or another well-known charge imparting agent for dispersion liquid can be used. Concrete examples of the metal organic acid salt include compounds (organic acid salts) of organic acids such as naphthenic acid, oleic acid, octylic acid, sulfonic acid, dodecyl acid, dodecylbenzene-sulfonic acid, and 2-ethylhexanoic acid, and metals such as zirconium, cobalt, copper, nickel, iron, zinc, lanthanum, gadolinium, sodium, and calcium. The concentration of the charge imparting agent 4 in the dispersion liquid 1 is set appropriately according to the type or the like of the charge imparting agent 4, and preferably falls within a range of 0.05 to 5 mass % relative to the perovskite crystal particles 3, for example.

The dispersion medium 2 forming the photoelectric conversion material dispersion liquid 1 is preferable to be an insulating liquid, in addition to being the poor solvent of perovskite crystal. Using the insulating dispersion medium 2 makes it easier for the perovskite crystal particles 3 to migrate and adhere to the film forming object, and makes it difficult for the perovskite crystal particles 3 to aggregate in the dispersion medium 2. Further, when later-described electrodeposition film forming and electrophotographic systems are applied in forming the photoelectric conversion film by causing the dispersion liquid 1 to adhere to the film forming object, the dispersion medium 2 is preferable to be an insulating liquid. The example of the insulating dispersion medium 2 is as described above, and as a more concrete example, there can be cited branched paraffin solvent mixtures such as Isopar G (registered trademark), Isopar H (registered trademark), Isopar K (registered trademark), Isopar L (registered trademark), Isopar M (registered trademark), and Isopar V (registered trademark), which are produced by Exxon. There are also the poor solvent of perovskite crystal.

The producing method of the photoelectric conversion material dispersion liquid 1 of the embodiment is not limited in particular, and the photoelectric conversion material dispersion liquid 1 can be produced by various methods. One example of the producing method of the dispersion liquid 1 is described below. First, the forming material of the perovskite crystal particles 3 (perovskite material), the poor solvent of perovskite crystal (first liquid), and the good solvent of perovskite crystal (second liquid) are prepared. The second liquid only needs to be one having a perovskite crystal solubility higher than that of the poor solvent, but is preferable to be a good solvent in consideration of solubility of the perovskite crystal. Further, for the second liquid, a solvent having a vapor pressure higher than that of the first liquid (poor solvent) is used.

The perovskite material and the second liquid (good solvent) are mixed to fabricate a first mixed solution containing the perovskite material. The first mixed solution is preferable to be a perovskite material solution. Then, the first mixed solution such as a perovskite material solution is added into the poor solvent (first liquid) to fabricate a second mixed solution. At least one of heating and depressurizing is performed on the second mixed solution to evaporate the second liquid (good solvent) from the second mixed solution. This makes it possible to cause the perovskite crystal ionized in the second liquid (good solvent) to crystallize (precipitate) in the poor solvent to form the perovskite crystal particles 3. In this manner, it is possible to obtain the dispersion liquid 1 in which the perovskite crystal particles 3 are dispersed in the poor solvent (dispersion medium 2).

The fabricating step of the second mixed solution and the crystallizing step of the perovskite material are preferably performed as follows, for example. First, an injector such as a microsyringe into which the perovskite material solution is filled is immersed in a container in which the poor solvent is put and is being stirred by a stirrer or the like, and the perovskite material solution is injected into the poor solvent. Thereafter, while being stirred in a state of the container being opened, the resultant liquid is heated or depressurized. By using the good solvent having a vapor pressure higher than that of the poor solvent, the good solvent can be removed selectively. Thereafter, the resultant is brought back to room temperature. As above, ions of the perovskite material in the good solvent crystallize in the poor solvent, to obtain the perovskite crystal particles 3 dispersed in the poor solvent. Further, according to need, classification such as filtering or centrifugal separation may be performed. As the good solvent of perovskite crystal, there can be cited N,N-dimethylformamide (DMF), N,N-dimethylacetamide (DMA), dimethylsulfoxide (DMSO), N-methyl-2-pyrrolidone (NMP), acetone, acetonitrile, and the like, for example.

The producing method of the photoelectric conversion material dispersion liquid 1 is not limited to the above-described method, and the photoelectric conversion material dispersion liquid 1 may be produced by such a method as described below, for example. For example, the photoelectric conversion material dispersion liquid 1 can be obtained also by a method in which a perovskite crystal ingot is produced and is pulverized by a wet mechanical dispersion method using the poor solvent to be subjected to classification appropriately. As the wet mechanical dispersion method, sand grinder, paint shaker, Nanomizer, and so on can be cited. For the classification, filtering, centrifugal separation, or the like is used. The dispersion liquid 1 containing the charge imparting agent 4 can be obtained by adding the charge imparting agent 4 into each of the dispersion liquids 1 produced by the above-described various methods.

[Producing Method and Producing Apparatus of Photoelectric Conversion Film]

Next, embodiments of a producing method and a producing apparatus of a photoelectric conversion film will be explained with reference to the drawings. Hereinafter, there will be mainly described a first embodiment in which a coating film forming method is applied to a producing step of the photoelectric conversion film, a second embodiment in which an electrodeposition film forming method is applied to a producing step of the photoelectric conversion film, and a third embodiment in which an electrophotographic system is applied to a producing step of the photoelectric conversion film. However, the producing method of the photoelectric conversion film is not limited to these. The producing method of the photoelectric conversion film of the embodiment only needs to be a method including a step of forming a film containing the perovskite crystal particles 3 on a film forming object as the photoelectric conversion film by causing the photoelectric conversion material dispersion liquid 1 of the embodiment to adhere on the film forming object. Further, the producing apparatus of the photoelectric conversion film of the embodiment only needs to an apparatus including a film forming mechanism that causes the photoelectric conversion material dispersion liquid 1 of the embodiment to adhere on a film forming object.

First Embodiment

Figure 4A:
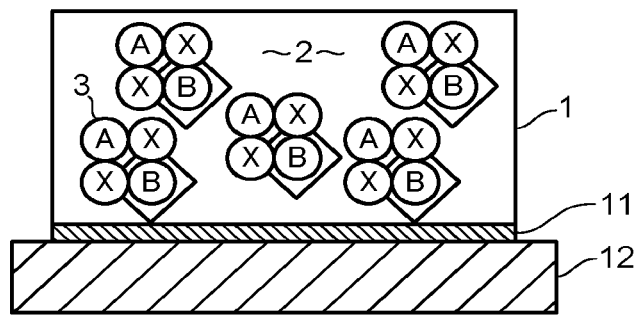
FIG. 4A to FIG. 4D are views each schematically illustrating a producing step of a photoelectric conversion film according to a first embodiment.

FIG. 4A to FIG. 4D each schematically illustrate a producing step of a photoelectric conversion film according to the first embodiment. As illustrated in FIG. 4A, a substrate 12 having a first electrode 11 is prepared as the film forming object. The photoelectric conversion material dispersion liquid 1 is applied on the first electrode 11 of the substrate 12. A coating method (and a coating mechanism) of the photoelectric conversion material dispersion liquid 1 only need to be a method (and a mechanism) capable of supplying the photoelectric conversion material dispersion liquid 1 onto the film forming object so as to have a uniform film thickness, and a liquid coating method such as, for example, a spin coating method, a slit coating method, a screen printing method, a spray method, or a meniscus coating method is applied.

Figure 4B:
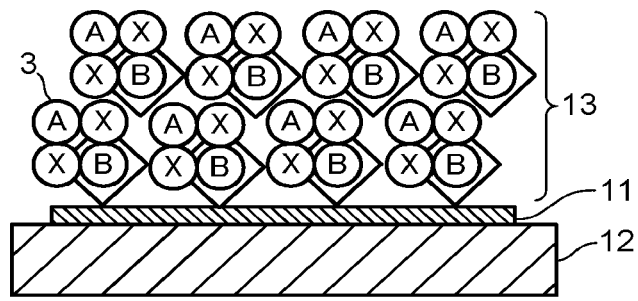
Figure 4C:
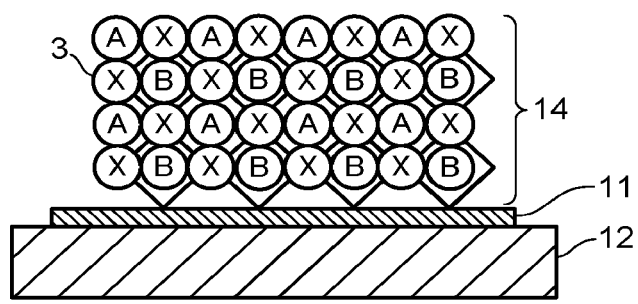
Figure 4D:
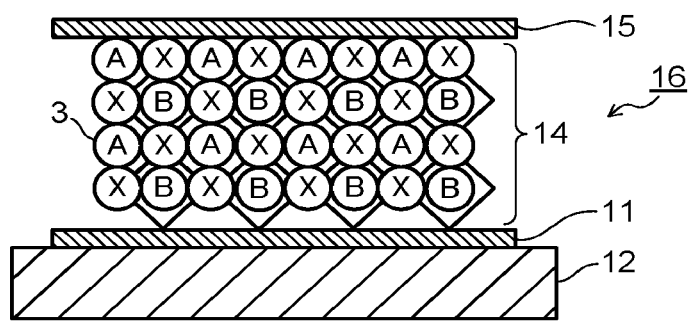

Next, as illustrated in FIG. 4B, the photoelectric conversion material dispersion liquid 1 applied on the first electrode 11 is dried to form a film 13 containing the perovskite crystal particles 3. The film 13 may be used as the photoelectric conversion film, but as illustrated in FIG. 4C, it is preferable that a packing process is performed on the film 13 to form a dense film 14. As the packing process, there can be cited a method of exposing the film 13 to the good solvent of perovskite crystal or its vapor, a method of heating the film 13, a method of pressurizing the film 13, a method in which these are combined, and the like. Such a packing process is performed to make the perovskite crystal film 14 dense, thereby making it possible to improve properties of a photoelectric conversion film (14). Further, as illustrated in FIG. 4D, a second electrode 15 is formed on the perovskite crystal film 14, to thereby form a photoelectric conversion device 16. Incidentally, the packing process and the apparatus will be described in detail later.

Figure 5A:
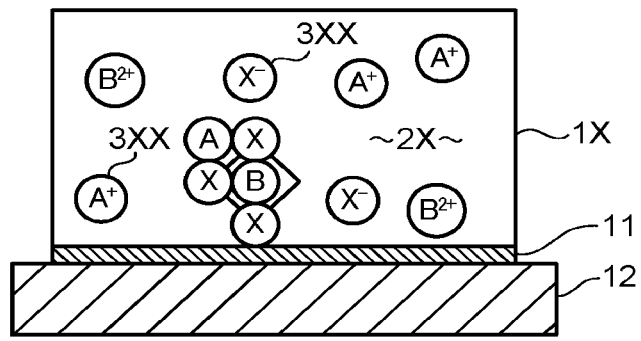
FIG. 5A to FIG. 5C are views each schematically illustrating a producing step of a photoelectric conversion film using the forming solution of the conventional photoelectric conversion film illustrated in FIG. 2.
Figure 5B:
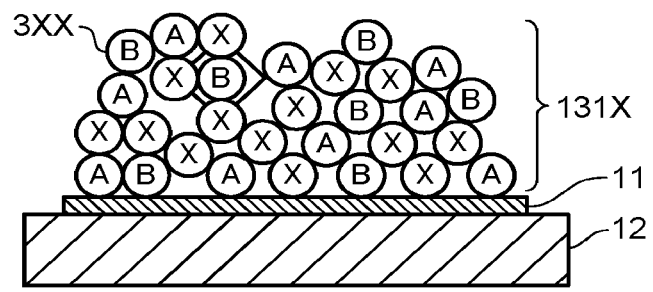
Figure 5C:
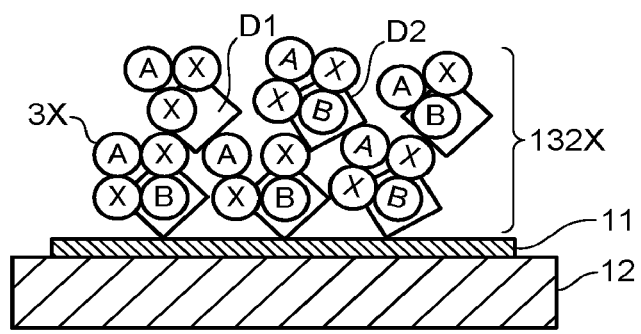

FIG. 5A to FIG. 5C each illustrate a producing step of a photoelectric conversion film using a forming solution of a conventional photoelectric conversion film, namely the solution 1X obtained by dissolving the perovskite crystal material 3XX in the good solvent 2X. First, the solution 1X is applied on the first electrode 11 of the substrate 12 (FIG. 5A) to be almost completely dried (FIG. 5B). Thereafter, an almost completely dried film 131X of the perovskite crystal material 3XX is heated to promote crystallization of the perovskite crystal material 3XX, and thereby a film 132X containing perovskite crystal particles 3X is formed (FIG. 5C). In the conventional film forming method, film properties of a perovskite crystal layer 132 are affected by a large number of factors and are liable to be affected by them. For example, the film properties are affected by drying conditions, solvent types, additives, impurities, solid content concentration, and temperature of a perovskite material solution, and further material, temperature, impurities, and irregularities of the film forming object surface. When a film is formed so as to have a large area, the drying conditions are likely to be nonuniform, so that the film properties are likely to be nonuniform. For this reason, morphology of a film to be obtained decreases, the size and shape of crystals and the film thickness become nonuniform, and further lattice defects, dislocation (D1), orientation displacement (D2) and the like of crystals are likely to occur in the film.

In contrast to such points, in the producing method of the photoelectric conversion film of the embodiment, the already-crystallized perovskite crystal particles 3 are supplied onto the film forming object, to be further subjected to the packing process according to need, so that the number of factors affecting the film properties of the perovskite crystal layer 14 is relatively small and impact of the factors is small. For this reason, it is possible to reproducibly form the uniform and high quality perovskite crystal layer 14 so as to have a large area. Thus, properties according to the properties of the perovskite crystal particles 3 prepared beforehand are obtained easily. Further, of the perovskite crystal layer 14, a pattern film forming property to an arbitrary shape can be improved as will be described later.

Here, the perovskite crystal having a three-dimensional structure has crystal orientation anisotropy of crystal growth smaller than that of the two-dimensional structure in general. In the case of the two-dimensional structure, the crystal orientation anisotropy of crystal growth is relatively large, so that even in the case of using the conventional method, a nanosheet-shaped crystal having a thin film thickness, which is the several 100 nm level, and having an area of a micrometer level is easily generated. On the other hand, in the case of the three-dimensional structure, the crystal orientation anisotropy of crystal growth is small, so that in the case of using the conventional film forming method, a crystal not in a sheet shape but in a block shape is easily generated. That is, it is difficult to achieve both the film thickness of the several 100 nm level, which is appropriate as the film thickness of the photoelectric conversion film, and the area of the micrometer level. With respect to such a point, applying the film forming method of the embodiment makes it possible to reproducibly form the uniform and high quality perovskite crystal layer 14 so as to have a large area. That is, the film forming method of the embodiment enables more effective effects to be obtained in the case of using the perovskite-type crystal having a three-dimensional structure.

Next, there are explained concrete examples of the producing apparatus (film forming apparatus) to which the producing step of the photoelectric conversion film according to the first embodiment is applied with reference to FIG. 6 to FIG. 9. FIG. 6 to FIG. 9 illustrate film forming apparatuses (coating apparatuses) 101 to which a meniscus coating method is applied. The film forming apparatus 101 includes: a stage 102 on which the film forming object such as the substrate 12 is disposed; a columnar coating head 103 disposed to face the stage 102; and a supply mechanism 104 that supplies, as a coating liquid, the photoelectric conversion material dispersion liquid 1 between the substrate 12 and the coating head 103, and is structured so as to move the stage 102 in a horizontal direction with respect to the coating head 103 whose position is fixed. In place of the movement of the stage 102, the coating head 103 may be moved, or the stage 102 and the coating head 103 may be moved simultaneously in directions opposite to each other or the same direction.

Figure 6:
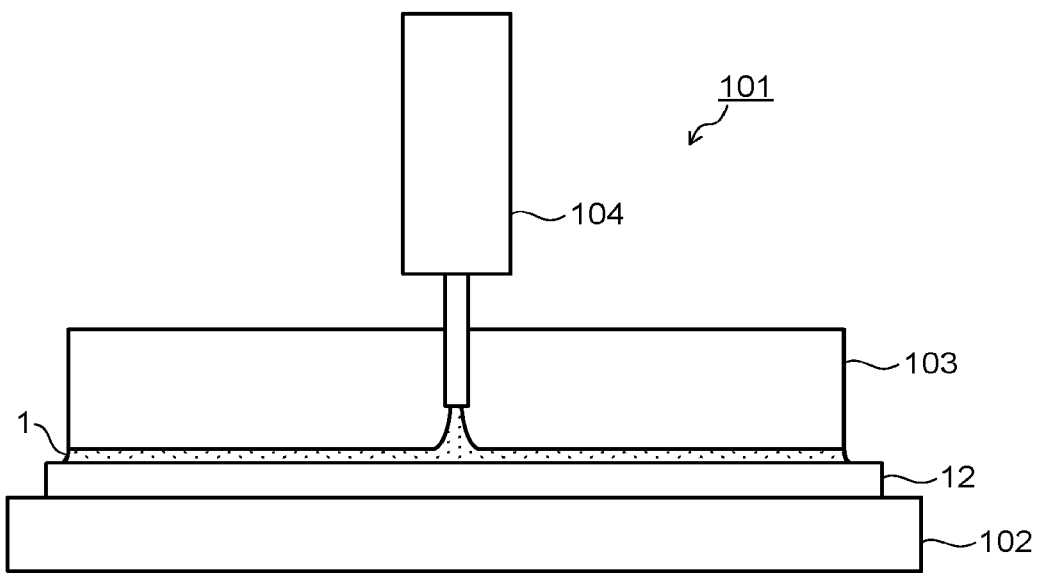
FIG. 6 is a front view illustrating a first example of a producing apparatus of a photoelectric conversion film to which the producing steps of the photoelectric conversion film according to the first embodiment are applied.
Figure 7:
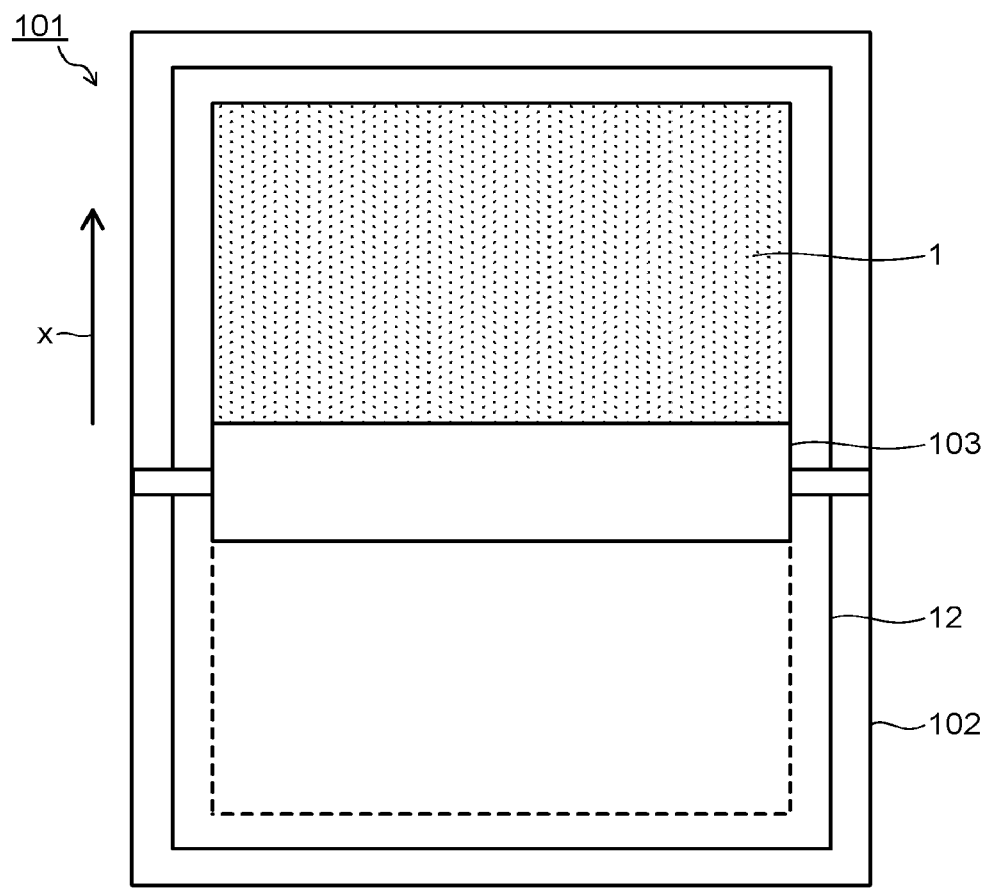
FIG. 7 is a plan view illustrating the first example of the producing apparatus of the photoelectric conversion film to which the producing steps of the photoelectric conversion film according to the first embodiment are applied.

In the film forming apparatus 101 illustrated in FIG. 6 and FIG. 7, the photoelectric conversion material dispersion liquid 1 is uniformly supplied between the substrate 12 and the coating head 103, to form a meniscus column. In a state where the position of the coating head 103 is fixed, the stage 102 is moved in the horizontal direction (the arrow x direction in the drawing). Thereby, the substrate 12 disposed on the stage 102 is moved with respect to the coating head 103, and the photoelectric conversion material dispersion liquid 1 is applied on the substrate 12 so as to spread by the coating head 103. Incidentally, the coating head 103 is normally used in an irrotational state. Thereafter, as described previously, drying of the dispersion liquid 1 and according to need, the packing process are performed.

Figure 8:
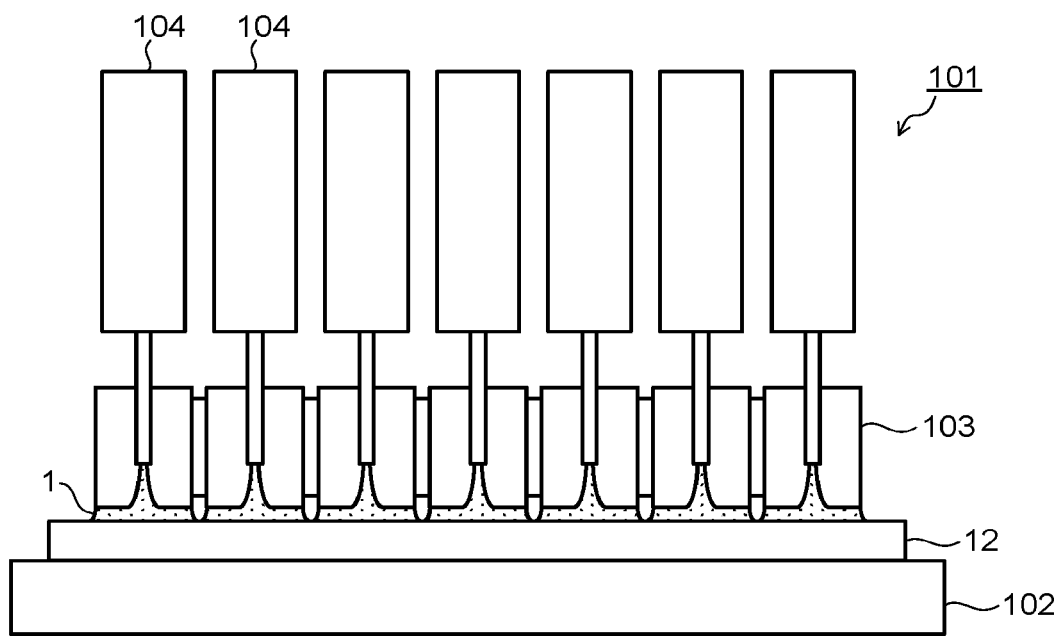
FIG. 8 is a front view illustrating a second example of the producing apparatus of the photoelectric conversion film to which the producing steps of the photoelectric conversion film according to the first embodiment are applied.
Figure 9:
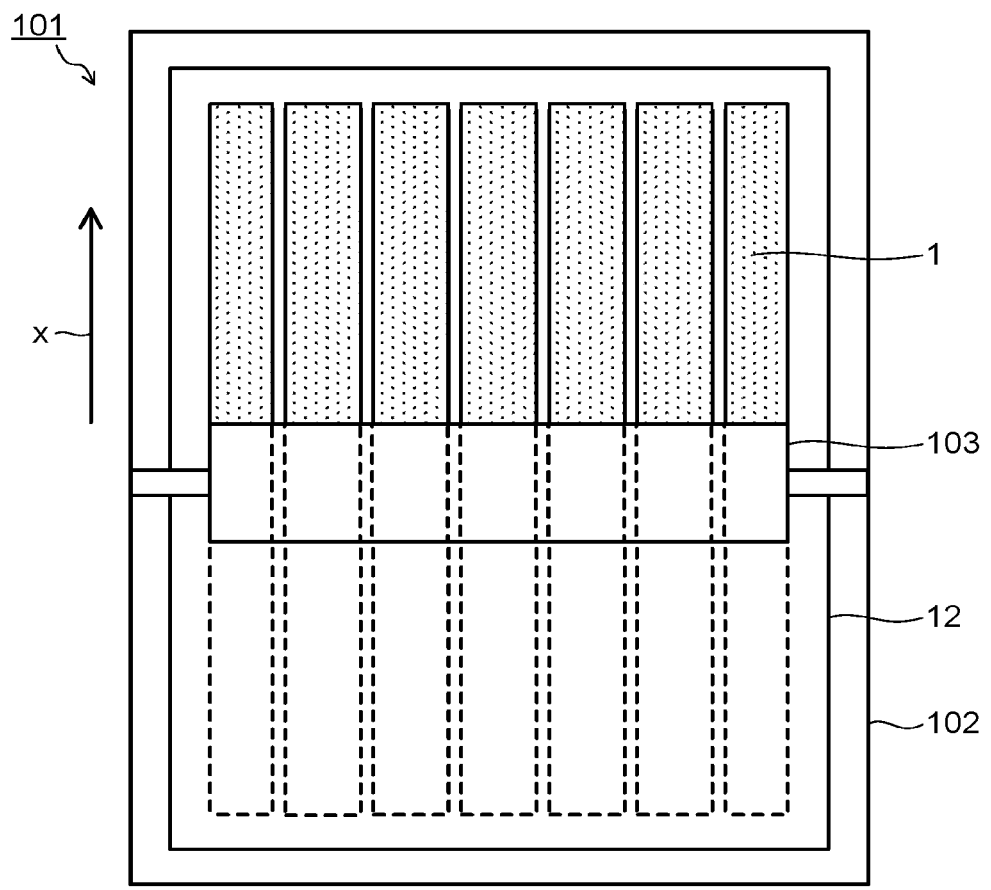
FIG. 9 is a plan view illustrating the second example of the producing apparatus of the photoelectric conversion film to which the producing steps of the photoelectric conversion film according to the first embodiment are applied.

In the film forming apparatus 101 illustrated in FIG. 8 and FIG. 9, the coating head 103 is divided into multiple regions in order to perform multiple strip-shaped pattern coating. Further, the supply mechanism 104 is provided for each of divided regions of the coating head 103 so as to supply the photoelectric conversion material dispersion liquid 1 into each of the divided regions. When the photoelectric conversion material dispersion liquid 1 is supplied between the substrate 12 and the coating head 103 from the plural supply mechanisms 104, according to the multiple-divided coating head 103, multiple-divided meniscus columns are formed. In a state where the position of the coating head 103 is fixed, the stage 102 is moved in the horizontal direction (the arrow x direction in the drawing), and thereby the photoelectric conversion material dispersion liquid 1 is pattern applied on the substrate 12 to have multiple strip shapes.

When it is necessary to pattern apply the photoelectric conversion material dispersion liquid 1, such a film forming apparatus 101 as illustrated in FIG. 8 and FIG. 9 is used. As will be described in detail later, there is sometimes a case that a plurality of strip-shaped cells are arranged and formed and the plural cells are connected in series when the photoelectric conversion device is applied to the photovoltaic module or the like. For the purpose of connecting the plural cells in series, a region not containing the perovskite crystal layer needs to be formed. In such a case, the multiple pattern coating by such a film forming apparatus 101 as illustrated in FIG. 8 and FIG. 9 is suitably applied. In the case when the photoelectric conversion film that does not require series connection is produced, and in the case when the photoelectric conversion material dispersion liquid 1 is applied and then patterning is performed, such a film forming apparatus 101 as illustrated in FIG. 6 and FIG. 7 is used.

Second Embodiment

Figure 10A:
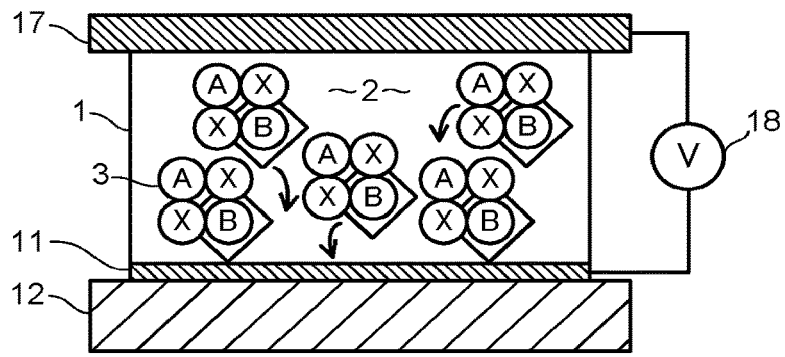
FIG. 10A to FIG. 10D are views each schematically illustrating a producing step of a photoelectric conversion film according to a second embodiment.
Figure 10B:
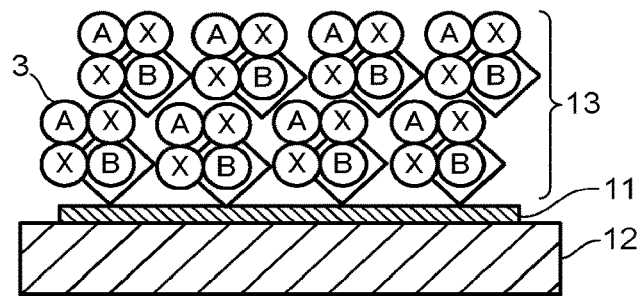
Figure 10C:
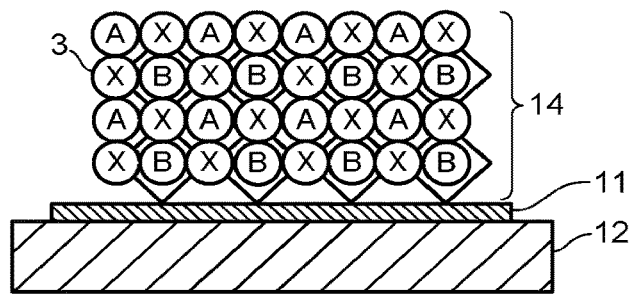
Figure 10D:
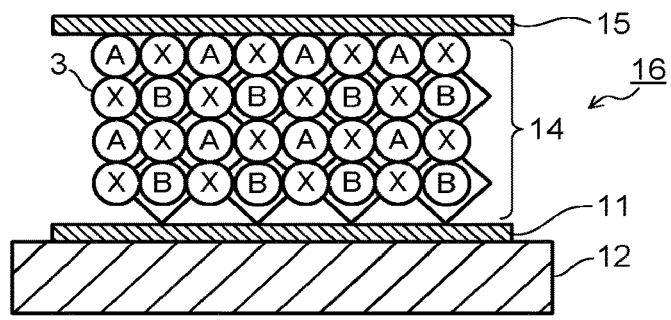

FIG. 10A to FIG. 10D each schematically illustrate a producing step of a photoelectric conversion film according to the second embodiment. As illustrated in FIG. 10A, an electrode for electrodeposition 17 is provided to face a first electrode 11 of a substrate 12. The photoelectric conversion material dispersion liquid 1 is made to exist between the first electrode 11 and the electrode for electrodeposition 17, and in this state, a voltage is applied to the first electrode 11 and the electrode for electrodeposition 17 from a power supply 18. A liquid tank, an enclosed structure, and the like that are capable of holding the photoelectric conversion material dispersion liquid 1, of which illustrations are omitted in FIG. 10A, are applied. By the applied voltage, the perovskite crystal particles 3 in the photoelectric conversion material dispersion liquid 1 are electrodeposited onto the first electrode 11. Due to existence of ionic impurities contained in the photoelectric conversion material dispersion liquid 1, the perovskite crystal particles 3 electrophoretically migrate. When the perovskite crystal particles 3 have dielectricity, the particles migrate by what is called dielectrophoresis. Alternatively, by applying a voltage, charge is injected into the perovskite crystal particles 3 and the particles electrophoretically migrate.

According to the second embodiment with voltage application, it is thought that as compared to the first embodiment, the perovskite crystal particles 3 are filled densely and in the case of the dielectrophoresis, the particles are filled in a state of crystal orientations being aligned. Further, by using the amine compound for the A site, the dielectric constant of the perovskite crystal particles 3 increases, thus being more preferable. When an electric line of force to occur by applying a voltage to the first electrode 11 and the electrode for electrodeposition 17 is nonuniform, the dielectrophoresis becomes likely to occur, thus being more preferable. Concretely, forming the first electrode layer 11 to have a planar shape and forming the electrode for electrodeposition 17 to have a point-like shape or a linear shape can be cited. An applied voltage V (V) is preferably set to establish $50<V/d<10000$ when a gap between the first electrode 11 and the electrode for electrodeposition 17 is set to d (mm). When the V/d ratio is 50 or less, migration does not easily occur, and when it is 10000 or more, dielectric breakdown becomes likely to occur. The dispersion medium 2 is preferable to be insulative as well as being the poor solvent simultaneously. Using the insulating dispersion medium 2 makes it easier for the perovskite crystal particles 3 to migrate and adhere to the first electrode 11.

When the above-described electrodeposition film forming method is applied, the photoelectric conversion material dispersion liquid 1 preferably contains the charge imparting agent 4. Adding the charge imparting agent 4 into the photoelectric conversion material dispersion liquid 1 makes it easier for the perovskite crystal particles 3 to migrate and to adhere to the film forming object, and makes it difficult for the perovskite crystal particles 3 to aggregate in the dispersion medium 2. By the perovskite crystal particles 3 migrating easily, the particles are thought to be filled more densely, resulting in that better properties are obtained. Incidentally, after the electrodeposition step (an adhesion step of the perovskite crystal particles 3 by electrodeposition) illustrated in FIG. 10A, similarly to the first embodiment, the drying step of the photoelectric conversion material dispersion liquid 1 (FIG. 10B), and according to need, the packing process step (FIG. 10C), and further the forming step of a second electrode 15 (FIG. 10D) are performed to fabricate a photoelectric conversion device 16.

Third Embodiment

Figure 11:
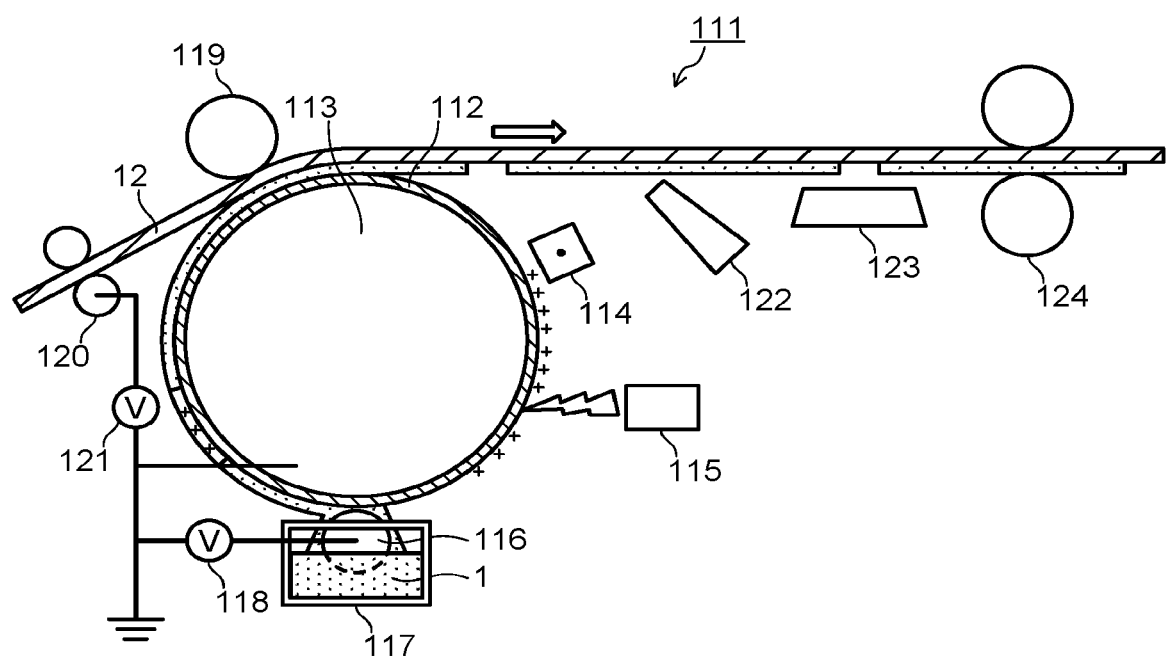
FIG. 11 is a view illustrating a producing apparatus of a photoelectric conversion film according to a third embodiment and a producing step of the photoelectric conversion film with application of the producing apparatus.

FIG. 11 illustrates a producing apparatus (film forming apparatus) 111 of a photoelectric conversion film according to the third embodiment and a producing step of a photoelectric conversion film using it. For the film forming apparatus 111 and the film forming step using it, what is called an electrophotographic system, which is used in a copying machine, a printer, and so on, is used. Using the electrophotographic system enables a photoelectric conversion film to be formed on the film forming object in an arbitrary pattern as well as in a strip shape. The film forming apparatus 111 includes: a photoconductive drum 113 having a photoconductive layer 112 as an electrostatic pattern support body; a charger 114 that charges the photoconductive layer 112; an exposure device 115 that exposes the photoconductive layer 112; an electrodeposition member 116 disposed to have a predetermined gap from the photoconductive drum 113; a container 117 that houses therein the photoelectric conversion material dispersion liquid 1 to be supplied to the electrodeposition member 116; a power supply 118 that applies a voltage to the electrodeposition member 116; a transfer member 119; a transfer bias applying member 120; and a power supply 121 that applies a voltage to the transfer bias applying member 120. A substrate having an electrode 11 (substrate with electrode) 12 is inserted between the photoconductive drum 113 and the transfer member 119.

While rotating the photoconductive drum 113, the charger 114 charges the photoconductive layer 112. When the exposure device 115 applies light to the photoconductive drum 113, by the function of the photoconductive layer 112, charges only at the light applied portion disappear and an electrostatic pattern (electrostatic latent image) is formed. The photoelectric conversion material dispersion liquid 1 is supplied between the photoconductive drum 113 and the electrodeposition member 116, and in this state, a voltage is applied to the electrodeposition member 116, and thereby the perovskite crystal particles (photoelectric conversion material particles) are selectively electrodeposited onto the photoconductive drum 113 according to the electrostatic pattern. The substrate with electrode 12 as the film forming object is inserted between the photoconductive drum 113 and the transfer member 119 and a voltage is applied to the electrode of the substrate 12, and thereby the pattern of the perovskite crystal particles formed on the photoconductive drum 113 is transferred onto the substrate with electrode 12. As a method of applying a voltage to the electrode of the substrate with electrode 12, it is possible to use a method in which the transfer bias applying member 120 is made to come into contact with the electrode and a voltage is applied to the electrode via the transfer bias applying member 120.

For the photoconductive layer 112 on the photoconductive drum 113, an arbitrary photoconductive layer such as an organic photoconductive layer or an amorphous silicon photoconductive layer can be used. For the charger 114, an arbitrary charger such as a corona charger or an ion flow device can be used. The polarity may be either positive or negative. For the exposure device 115, an arbitrary exposure device using a laser, an LED, or the like can be used. For the electrodeposition member 116, an arbitrary member capable of applying an electric field can be used. For example, a roller-shaped member made of stainless steel or the like is immersed into the photoelectric conversion material dispersion liquid 1 and the roller member is rotated, and thereby a voltage is applied while drawing the photoelectric conversion material dispersion liquid 1, and thereby, while exhibiting a function to supply the photoelectric conversion material dispersion liquid 1 onto the photoconductive drum 113, electrodeposition can be performed.

The polarity of the voltage to be applied to the electrodeposition member 116 may be either positive or negative. For example, when the charge polarity of the perovskite crystal particles in the photoelectric conversion material dispersion liquid 1 is positive and the charge polarity of the photoconductive drum 113 is positive, the voltage to be applied to the electrodeposition member 116 is made to have positive polarity lower than a charge potential of the photoconductive drum 113, and thereby the perovskite crystal particles are electrodeposited only onto the exposed portion of the photoconductive drum 113 (a reversal development system in the electrophotographic technique). As another example, when the charge polarity of the perovskite crystal particles in the photoelectric conversion material dispersion liquid 1 is positive and the charge polarity of the photoconductive drum 113 is negative, the voltage to be applied to the electrodeposition member 116 is made to have negative polarity lower than a potential of the exposed portion of the photoconductive drum 113, and thereby the perovskite crystal particles are electrodeposited only onto the unexposed portion of the photoconductive drum 113 (a regular development system in the electrophotographic technique).

For the transfer bias applying member 120, an arbitrary member capable of applying a voltage can be used. For example, by applying a voltage while rotating conductive elastic rubber rollers in a state of abutting on the substrate with electrode 12, the pattern of the perovskite crystal particles on the photoconductive drum 113 can be transferred onto the substrate with electrode without damaging the surface of the substrate with electrode 12.

The film forming apparatus 111 illustrated in FIG. 11 further includes: a drying device 122; as a packing process device, a good solvent exposure device 123 and a heating•pressurizing device 124. Using the drying device 122 makes it possible to shorten a drying time of a perovskite crystal particle layer transferred onto the substrate with electrode 12. To the drying device 122, an arbitrary system such as a gas blowing system, a heating system, or an infrared system can be applied. For the packing process, it is possible to use a method in which the good solvent is exposed to the perovskite crystal particle layer, and then the substrate with electrode 12 is passed through between a pair of heat pressing members, at least one of which is heated, to thereby perform heating and pressuring, or the like. By performing at least one of the good solvent exposure and the heating and pressuring, a packing process effect can be obtained.

For the good solvent exposure device 123, it is possible to use a system of supplying the good solvent in a liquid state to the perovskite crystal particle layer formed on the substrate with electrode 12, a system of supplying the good solvent in a gas state or a mist state, or the like. For example, there can be cited a system in which a container containing the good solvent therein is heated to generate vapor, an ultrasonic atomization system, a spray system, and the like. For the heat pressing members of the heating•pressurizing device 124, for example, elastic rubber rollers each having a built-in heater therein can be used. It is possible to use a method in which these two rollers are disposed to face each other and the two rollers are pressed against each other while the substrate with electrode 12 having the perovskite crystal particle layer being passed through between the two, or the like. When the surface of the rollers has a high release property, it is more preferable because it is possible to suppress a phenomenon in which the perovskite crystal particle layer adheres to the roller side. For example, it is possible to use a system of covering the surfaces of the rubber rollers with a thin tube formed of a fluorine-based material such as PTFE.

According to the film forming apparatus 111 illustrated in FIG. 11, it is possible to form the photoelectric conversion film by what is call a roll-to-roll method in which the substrate with electrode undergoes steps from the transfer step to the packing step without pause. However, the film forming apparatus 111 with application of the electrophotographic system is not limited to this, and can also use a system in which a single wafer substrate with electrode is used and each step is performed sequentially. Incidentally, a set step, a squeezing step, and the like in the electrophotographic technique may be provided between the electrodeposition step and the transfer step. The set step is a step of increasing adhesion between the photoconductive drum 113 and the perovskite crystal particles. The squeezing step is a step of squeezing the redundant dispersion medium of the photoelectric conversion material dispersion liquid 1 on the photoconductive drum 113. Further, a cleaning step may be provided from the transfer step to the electrodeposition step. The cleaning step is a step of cleaning the perovskite crystal particles remaining on the photoconductive drum 113 after the transfer step. For the set step, the squeezing step, and the cleaning step, arbitrary steps used generally in the electrophotographic technique can be used. Incidentally, already known pattern film forming methods using an electrostatic force other than the electrophotographic system may be used, and an ion flow system and the like can be cited.

[Photoelectric Conversion Device]

Next, there is explained an embodiment of the photoelectric conversion device with reference to the drawings. In the following, there will be mainly described an embodiment in which the photoelectric conversion device is applied to a photovoltaic module. However, the photoelectric conversion device of the embodiment is not limited to this. The photoelectric conversion device of the embodiment can be applied to a photosensor, a light emitting element, a photodiode, an optical memory, and so on other than the photovoltaics. Further, in the following, a photovoltaic module in which a plurality of strip-shaped cells are arranged and formed and the plural cells are connected in series will be mainly described, but the photovoltaic module may be a photovoltaic module having a single large area cell. The same is true of other photoelectric conversion devices.

Figure 12:
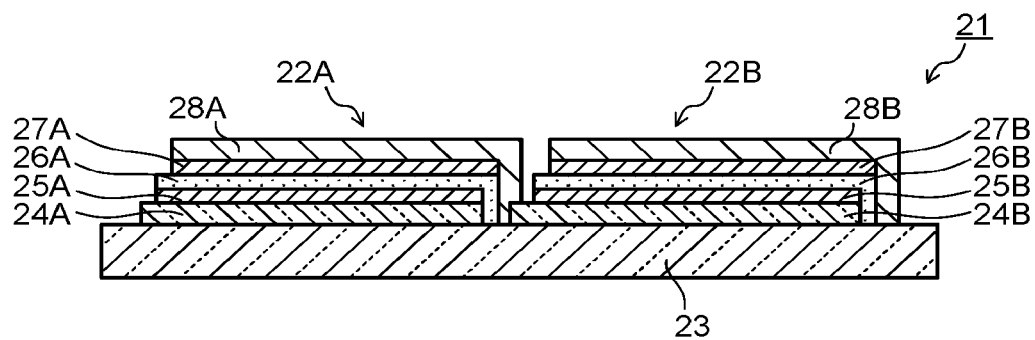
FIG. 12 is a cross-sectional view illustrating one example of a photoelectric conversion device of an embodiment.

FIG. 12 illustrates a photovoltaic module to which the photoelectric conversion device of the embodiment is applied. A photovoltaic module 21 illustrated in FIG. 12 includes a plurality of cell parts 22A and 22B connected in series. On a supporting substrate 23, a plurality of separated transparent electrodes (first electrodes) 24A and 24B are formed. On the transparent electrodes 24A and 24B, photoelectric conversion films 26A and 26B are formed respectively via first intermediate layers 25A and 25B. On the photoelectric conversion films 26A and 26B, counter electrodes (second electrodes) 28A and 28B are formed respectively via second intermediate layers 27A and 27B. The first and second intermediate layers 25A, 25B, 27A, and 27B are provided according to need. The counter electrode (second electrode) 28A of the cell part 22A is electrically connected to the transparent electrode (first electrode) 24B of the cell part 22B.

The photoelectric conversion films 26 (26A and 26B) each are the perovskite crystal layer formed by the film forming method of the embodiment using the photoelectric conversion material dispersion liquid of the aforesaid embodiment, and the perovskite crystal layer preferably contains the charge imparting agent. The thickness of the photoelectric conversion films 26 preferably falls within a range of 10 to 1000 nm. Light such as sunlight or illumination light is emitted to the photoelectric conversion films 26 from the supporting substrate 23 side, for example. When the photoelectric conversion films 26 made of the perovskite crystal layer absorb the light emitted to the photovoltaic module 21, a hole and its paired electron are generated. Out of generated electrons and holes, for example, the electrons are collected in the transparent electrodes (first electrodes) 24 (24A and 24B) via an electron transport layer as the first intermediate layers 25 (25A and 25B), and the holes are collected in the counter electrodes (second electrodes) 28 (28A and 28B) via a hole transport layer as the second intermediate layers 27 (27A and 27B).

The supporting substrate 23 is formed of a material having insulating performance. When the light from the supporting substrate 23 side is used, the supporting substrate 23 is formed of a material having a light transmission property. As the constituent material of the supporting substrate 23, an inorganic material such as non-alkali glass, quartz glass, or sapphire, or an organic material such as polyethylene (PE), polyethylene terephthalate (PET), polyethylene naphthalate (PEN), polyimide, polyamide, polyamide-imide, or a liquid crystal polymer is used. The supporting substrate 23 may be a rigid substrate formed of an inorganic material or an organic material, or may be a flexible substrate formed of an organic material or a very thin inorganic material.

The first electrodes 24 are formed of a material having a light transmission property and conductivity when the light from the supporting substrate 23 side is used. As the constituent material of the first electrodes 24, there can be cited a conductive metal oxide such as indium oxide, zinc oxide, tin oxide, indium tin oxide (ITO), fluorine-doped tin oxide (FTO), indium-zinc oxide (IZO), or indium-gallium-zinc oxide (IGZO), metal such as gold, platinum, silver, copper, titanium, zirconium, cobalt, nickel, indium, or aluminum, or an alloy containing any of these metals, a conductive polymer such as poly(3, 4-ethylenedioxythiophene)/poly(4-styrenesulfonate) (PEDOT/PSS), and the like. The first electrodes 24 are formed by, for example, a vacuum deposition method, a sputtering method, an ion plating method, a plating method, a coating method, or the like.

The electron transport layer has functions to block the hole generated in the photoelectric conversion films 26 and to selectively and efficiently transport the electron to the first electrode layers 24, and the like. For the electron transport layer, a metal oxide such as zinc oxide, titanium oxide, or gallium oxide, an organic material such as polyethyleneimine, or the like is used. The hole transport layer has functions to block the electron generated in the photoelectric conversion films 26 and to selectively and efficiently transport the hole to the second electrode layers 28, and the like. For the hole transport layer, there is used an organic conductive polymer such as PEDOT/PSS, polythiophene, polypyrrole, triphenylenediaminepolypyrrole, or polyaniline, a metal oxide such as tungsten oxide, molybdenum oxide, or vanadium oxide, fullerene hydride such as $C_{60}H_{36}$ or $C_{70}H_{36}$, fullerene oxide being oxidized $C_{60}$ or $C_{70}$, a fullerene metal complex, or a fullerene derivative such as [6,6] phenyl$C_{61}$butyric acid methylester (PC60BM), [6,6] phenyl$C_{71}$butyric acid methylester (PC70BM), or bis-indene$C_{60}$ (60ICBA). The electron transport layer and the hole transport layer are formed by a vacuum film forming method such as a vacuum deposition method or a sputtering method, a sol gel method, a coating method, or the like.

The second electrodes 28 (28A and 28B) are formed of a material having conductivity, and in some case, having a light transmission property. As the constituent material of the second electrodes 28, there can be cited, for example, metal such as platinum, gold, silver, copper, nickel, cobalt, iron, manganese, tungsten, titanium, zirconium, tin, zinc, aluminum, indium, chromium, lithium, sodium, potassium, rubidium, cesium, calcium, magnesium, barium, samarium, or terbium, an alloy containing any of these, a conductive metal oxide such as indium-zinc oxide (IZO), a conductive polymer such as PEDOT/PSS, and a carbon material such as graphene or a carbon nanotube, and the like. The second electrodes 28 are formed by, for example, a vacuum film forming method such as a vacuum deposition method or a sputtering method, a sol gel method, a coating method, or the like.

In the photoelectric conversion device 21 of the embodiment, the perovskite crystal layer formed by the film forming method of the embodiment using the photoelectric conversion material dispersion liquid of the aforesaid embodiment is applied to the photoelectric conversion films 26, so that it is possible to achieve the area enlargement of the photoelectric conversion films 26. Further, the photoelectric conversion material dispersion liquid of the embodiment, particularly, the photoelectric conversion material dispersion liquid containing the charge imparting agent is excellent in pattern film forming property, so that it is possible to enhance formability of the photoelectric conversion films 26 of such a case when a plurality of cells (modules) are connected in series as illustrated in FIG. 12. Accordingly, it becomes possible to provide a photoelectric conversion device in which a plurality of cells are connected in series to thereby suppress performance deterioration caused by area enlargement.

Figure 13:
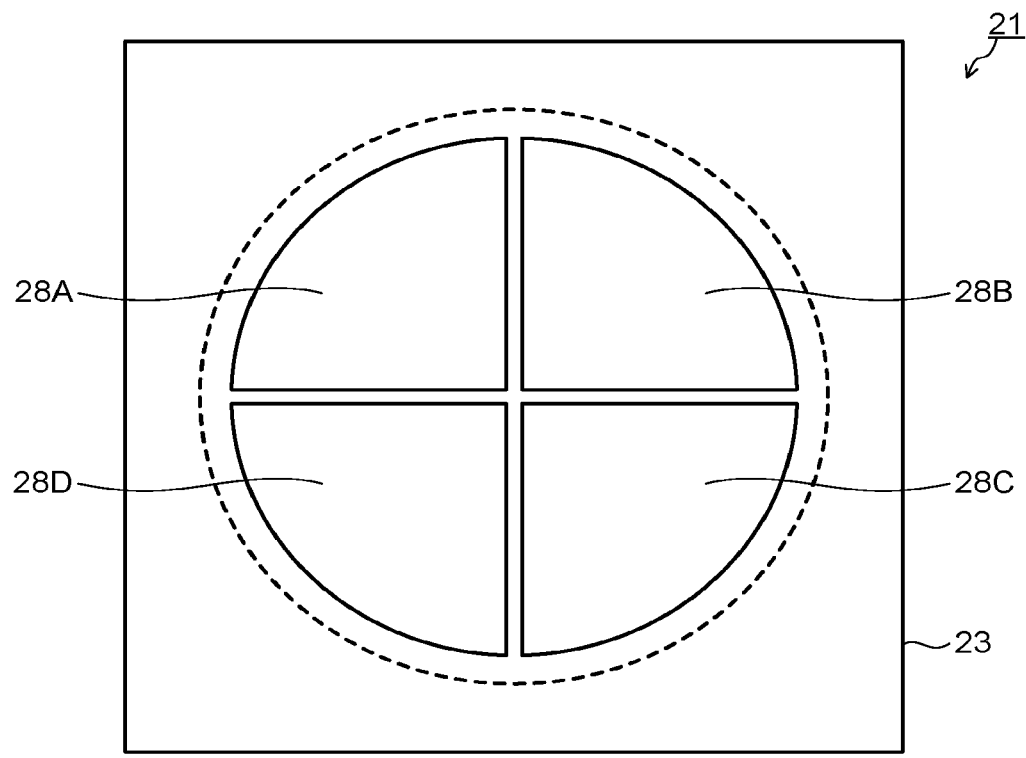
FIG. 13 is a plan view illustrating another example of the photoelectric conversion device of the embodiment.

FIG. 13 is a view illustrating another example of the photoelectric conversion device (photovoltaic module) of the embodiment. FIG. 13 illustrates counter electrodes 28 of a photoelectric conversion device 21. The photoelectric conversion device 21 includes a plurality of sector-shaped cell parts, and these cell parts are disposed radially and are connected in series. The plural cell parts include sector-shaped counter electrodes 28A, 28B, 28C, and 28D respectively. Such a circular series module is suitable for photovoltaics intended for wrist watch. By combining the photoelectric conversion material dispersion liquid of the embodiment with, for example, the film forming method of the electrophotographic system, a photoelectric conversion film having an arbitrary pattern shape can be formed, resulting in that it becomes possible to produce and provide photoelectric conversion devices having various shapes.

Next, there will be described examples and evaluation results thereof.

Example 1

In Example 1, the film forming apparatus 101 illustrated in FIG. 6 and FIG. 7 was used to form a perovskite photoelectric conversion film having a power generation portion area of 10 mm×10 mm, and with use of it, perovskite photovoltaics were fabricated. First, as a supporting substrate with transparent electrode, a non-alkali glass substrate of 100 mm×100 mm having an ITO layer was prepared, and as a pretreatment, UV ozone cleaning was performed.

On the non-alkali glass substrate having the ITO layer, as a first intermediate layer, a PEDOT•PSS layer having a thickness of about 50 nm was film formed as follows. On the stage of the meniscus coating apparatus illustrated in FIG. 6 and FIG. 7, the above-described substrate was disposed. The coating head was disposed above the substrate to have a 0.3 mm gap therebetween. Then, a PEDOT•PSS ink was supplied to spread over the entire region in the width direction of the coating head by using the supply device. The stage was moved in the horizontal direction at a speed of 4 mm/s in a state where the position of the coating head was fixed, to thereby film form the PEDOT•PSS layer. Thereafter, drying was performed at 120° C. for 30 minutes. As the PEDOT•PSS, Clevios AI4083 produced by Heraeus Holding GmbH was used. Hereinafter, the non-alkali glass substrate having the ITO layer and the PEDOT•PSS layer will be described as a substrate to be processed.

Next, a perovskite crystal layer was film formed on the substrate to be processed as follows. First, a perovskite material dispersion liquid was produced as follows. To 100 mL of acetonitrile, 30.4 mg of methylammonium iodide ($CH_3NH_3I$) and 88 mg of lead iodide ($PbI_2$) were added to prepare a solution, and this was filled into a microsyringe. In a sample bottle in which Isopar L (registered trademark produced by Exxon Mobil Corporation) was put and was being stirred, a needle of the microsyringe was immersed and the perovskite material solution was injected therethrough. A lid of the sample bottle was opened and the sample bottle was heated at 60° C. for 30 minutes while stirring the perovskite material solution. After being brought back to room temperature, the resultant went through a filter having a pore diameter of 5 µm, and thereby the perovskite material dispersion liquid was prepared. The average particle diameter found by laser diffraction/scattering particle size distribution measurement was about 280 nm.

Similarly to the PEDOT•PSS layer, the perovskite crystal layer was film formed using the meniscus coating apparatus. The film forming was performed under a nitrogen atmosphere. The gap between the substrate to be processed and the coating head was set to 0.88 mm, the moving speed of the stage was set to 10 mm/s, and the perovskite material dispersion liquid was applied on the substrate to be processed, to be dried naturally. Then, by performing heating at 90° C. for two hours under a nitrogen atmosphere, a packing process of the perovskite crystal layer was performed. The thickness of the perovskite crystal layer after the packing process was about 400 nm.

Then, as a second intermediate layer, a PC60BM layer having a thickness of about 100 nm was film formed as follows. To 1 mL of monochlorobenzene, 20 mg of PC60BM was added to be stirred, to thereby produce a PC60BM dispersion liquid. The PC60BM layer was film formed using the meniscus coating apparatus. The film forming was performed under a nitrogen atmosphere. The gap between the substrate to be processed and the coating head was set to 0.88 mm, the moving speed of the stage was set to 8 mm/s, and the PC60BM dispersion liquid was applied on the substrate to be processed, to be dried naturally. Then, as a third intermediate layer, a BCP (2,9-dimethyl-4,7-diphenyl-1,10-phenanthroline (bathocuproine)) layer having a thickness of about 10 nm, and as a second electrode layer, an Ag layer having a thickness of about 60 nm were film formed by a vacuum deposition method.

Power conversion efficiency of the perovskite photovoltaics fabricated in this manner was measured to reveal that the power conversion efficiency was 5.7% being an average value of three samples. The measurement of the power conversion efficiency was performed by using a solar simulator with a reference spectrum of 100 $mW/cm^2$ irradiance and 1.5 G air mass (AM). The same is true of the following examples and comparative examples.

Comparative Example 1

Fabrication and evaluation of a perovskite photovoltaic cell were performed in the same manner as in Example 1 except for the film forming process of the perovskite layer. To 1 mL of dimethylformamide (DMF), 185 mg of $CH_3NH_3I$ and 538 mg of $PbI_2$ were added to be stirred, and further the resultant went through a filter having a pore diameter of 5 µm, and thereby a perovskite material solution was prepared. The film forming of the perovskite layer was performed using the meniscus coating apparatus. The film forming was performed under a nitrogen atmosphere. The gap between the substrate to be processed and the coating head was set to 0.88 mm, the moving speed of the stage was set to 10 mm/s, and the perovskite solution was applied on the substrate to be processed, to then be dried forcibly by blowing nitrogen over a liquid film. The homogeneous perovskite layer can be film formed as compared to natural drying. Thereafter, by performing heating at 80° C. for two hours, crystallization of the perovskite layer was advanced. Further, similarly to Example 1, by performing heating at 90° C. for two hours under a nitrogen atmosphere, a packing process of the perovskite layer was performed. The thickness of the perovskite layer was about 400 nm similarly to Example 1. Power conversion efficiency of perovskite photovoltaics fabricated in this manner was 5.5% being an average value of three samples. A power conversion efficiency improved ratio of Example 1 to Comparative example 1 was 1.04.

Example 2

Fabrication and evaluation of a perovskite photovoltaic cell were performed in the same manner as in Example 1 except for the packing process of the perovskite layer. For the packing process, a solvent vapor exposure method was used. A small amount of DMF was dropped into a container in a nitrogen atmosphere, and further a substrate obtained after the perovskite material dispersion liquid was applied thereon to be dried naturally was put in the container, and the container was sealed hermetically to be left to stand for 10 minutes, and thereby the packing process by the solvent vapor exposure was performed. Power conversion efficiency of perovskite photovoltaics fabricated in this manner was 6.4% being an average value of three samples, which was higher efficiency than Example 1.

Comparative Example 2

Fabrication and evaluation of a perovskite photovoltaic cell were performed in the same manner as in Example 2 except for the film forming process of the perovskite layer. The film forming of the perovskite layer was performed in the same manner as in Comparative example 1. Thereafter, similarly to Example 2, a packing process by solvent vapor exposure was performed and film forming of the perovskite layer was performed. Power conversion efficiency of perovskite photovoltaics fabricated in this manner was 5.9% being an average value of three samples. A power conversion efficiency improved ratio of Example 2 to Comparative example 2 was 1.08. Further, this value was an improved ratio higher than that by the packing process by heating used in Example 1 and Comparative example 1.

Example 3

Fabrication and evaluation of a perovskite photovoltaic cell were performed in the same manner as in Example 1 except for the packing process of the perovskite layer. For the packing process, pressurizing was used. In a nitrogen atmosphere, as a protection sheet, a PTFE sheet was put on the perovskite crystal layer side and the substrate was sandwiched by two metal plates to be pressurized, and thereby the packing process was performed. The pressure during pressurizing was adjusted to a pressure to be about 30 kg weight per 1 $cm^2$ area of the substrate. Power conversion efficiency of perovskite photovoltaics fabricated in this manner was 6.5% being an average value of three samples, which was higher efficiency than Examples 1 and 2.

Comparative Example 3

Fabrication and evaluation of a perovskite photovoltaic cell were performed in the same manner as in Example 3 except for the film forming process of the perovskite layer. The film forming of the perovskite layer was performed in the same manner as in Comparative example 1. Thereafter, similarly to Example 3, a packing process by pressurizing was performed and film forming of the perovskite layer was performed. Power conversion efficiency of perovskite photovoltaics fabricated in this manner was 5.9% being an average value of three samples. A power conversion efficiency improved ratio of Example 3 to Comparative example 3 was 1.10. This value was an improved ratio higher than that by the packing process by heating used in Example 1 and Comparative example 1 and by the packing process by solvent vapor exposure used in Example 2 and Comparative example 2.

Example 4

Fabrication and evaluation of a perovskite photovoltaic cell were performed in the same manner as in Example 1 except for the packing process of the perovskite layer. For the packing process, three of solvent vapor exposure, heating, and pressurizing were used in combination. After the solvent vapor exposure was performed under the same condition as in Example 2, as soon as being taken out from a solvent vapor container, the substrate was pressurized by two metal plates heated to 90° C. The pressurizing condition was set to the same as in Example 3. Power conversion efficiency of perovskite photovoltaics fabricated in this manner was 7.2% being an average value of three samples, which was higher efficiency than Examples 1 to 3.

Comparative Example 4

Fabrication and evaluation of a perovskite photovoltaic cell were performed in the same manner as in Example 4 except for the film forming process of the perovskite layer. The film forming of the perovskite layer was performed in the same manner as in Comparative example 1. Thereafter, similarly to Example 4, a packing process using three of solvent vapor exposure, heating, and pressurizing in combination was performed. Power conversion efficiency of perovskite photovoltaics fabricated in this manner was 5.9% being an average value of three samples. A power conversion efficiency improved ratio of Example 4 to Comparative example 4 was 1.22. This value was an improved ratio higher than that by the packing process by heating used in Example 1 and Comparative example 1, by the packing process by solvent vapor exposure used in Example 2 and Comparative example 2, and by the packing process by pressurizing used in Example 3 and Comparative example 3.

Example 5

Fabrication and evaluation of a perovskite photovoltaic cell were performed in the same manner as in Example 4 except that the power generation portion area was set to 12×50 mm. Power conversion efficiency of perovskite photovoltaics fabricated in this manner was 6.7% being an average value of three samples.

Comparative Example 5

Fabrication and evaluation of a perovskite photovoltaic cell were performed in the same manner as in Example 5 except for the film forming process of the perovskite layer. The film forming of the perovskite layer was performed in the same manner as in Comparative example 1. Power conversion efficiency of perovskite photovoltaics fabricated in this manner was 2.3% being an average value of three samples. A power conversion efficiency improved ratio of Example 5 to Comparative example 5 was 2.91. This value was an improved ratio much higher than that in the case when the photovoltaic cell having a small power generation portion area explained in Example 4 and Comparative example 4 was used. That is, in the case of the film forming method using the perovskite material solution, the film properties are low in uniformity, so that as the formed film area increases, the power conversion efficiency decreases significantly. In contrast to this, in the case of the film forming method using the perovskite material dispersion liquid, the film properties are high in uniformity, so that even when the formed film area increases, the power conversion efficiency does not decrease easily.

Example 6

Fabrication and evaluation of a perovskite photovoltaic module were performed in the same manner as in Example 5 except that the device type was changed to a series module from a cell and with this change, the film forming method was changed to pattern film forming. The PEDOT•PSS layer being the first intermediate layer and the perovskite crystal layer were pattern film formed using the film forming apparatus 101 illustrated in FIG. 8 and FIG. 9. The structure of the photovoltaic module is one in which adjacent cells are connected in series as illustrated in FIG. 12. Power conversion efficiency of perovskite photovoltaics fabricated in this manner was 5.5% being an average value of three samples. The power generation portion area of a single cell in the serial module is set to 12×50 mm similarly to Example 5, and a ratio of the power generation portion area to a light irradiated area, namely a numerical aperture ratio is 94%.

Comparative Example 6

Fabrication and evaluation of a perovskite photovoltaic module were performed in the same manner as in Example 6 except for the film forming process of the perovskite layer. To the film forming process of the perovskite layer, the method using the perovskite material solution was applied. When the pattern film forming was performed by the method using the perovskite material solution, a phenomenon in which a coating film spreads occurred, resulting in that the perovskite layer was film formed even on a series connection portion. The power conversion efficiency was 0.1%, and after all, Comparative example 6 did not operate as photovoltaics. As compared to the method using the perovskite material dispersion liquid, pattern accuracy of the method using the solution is low. As causes of the phenomenon in which a coating film spreads, a difference in wettability of a coating liquid with respect to a film forming object, a difference in presence/absence of ions in the coating liquid, a difference in presence/absence of a crystal growth phenomenon, a difference in viscosity of the coating liquid, a difference in solvent drying speed of the coating liquid, and the like are thought.

Example 7

Figure 14:
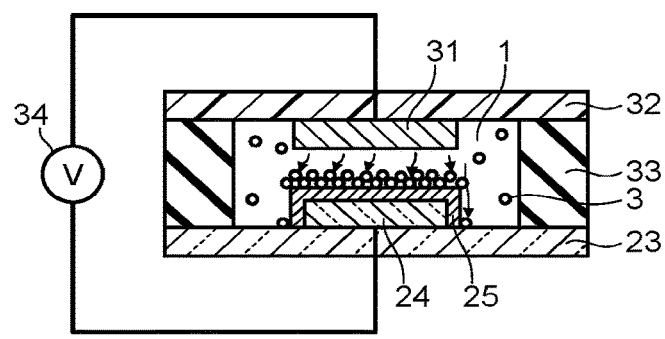
FIG. 14 is a view illustrating a producing apparatus of a photoelectric conversion film used in Example 7.

Fabrication and evaluation of a perovskite photovoltaic cell were performed in the same manner as in Example 1 except for using electrodeposition for the film forming of the perovskite layer. The electrodeposition process was performed using a film forming apparatus illustrated in FIG. 14. A supporting substrate 23 with electrode (24) having had a first intermediate layer 25 film formed thereon and a base for electrodeposition 32 having a counter electrode for electrodeposition 31 thereon were faced to each other with a spacer 33 disposed therebetween. The perovskite material dispersion liquid 1 was injected into a gap between the both described above, a voltage was applied between the first electrode 24 and the counter electrode for electrodeposition 31 from a power supply 34, and thereby the perovskite crystal particles 3 were electrodeposited onto the first intermediate layer 25.

The thickness of the spacer 33 was set to 0.5 mm, and the applied voltage was set to direct current 500 V. Thereafter, the base for electrodeposition 32 was removed and natural drying was performed. Similarly to Example 1, the packing process by heating was performed. The film thickness of the perovskite crystal layer was about 400 nm. Power conversion efficiency of perovskite photovoltaics fabricated in this manner was 6.2% being an average value of three samples. This value was of course high as compared to Comparative example 1, and was a value much higher than that of Example 1 in which the perovskite crystal layer was film formed by coating. At the time of the electrodeposition process, a voltage was applied so that the first electrode 24 became a negative electrode, to thereby electrodeposit the perovskite crystal particles 3 onto the first electrode 24 side. That is, it is inferred that what is called a dielectrophoresis phenomenon in which the perovskite crystal particles 3 migrate regardless of being positively charged or not being charged is occurring.

Example 8

Fabrication and evaluation of a perovskite photovoltaic cell were performed in the same manner as in Example 7 except for adding the charge imparting agent to the perovskite material dispersion liquid. As the charge imparting agent, a mineral spirit solution of zirconium naphthenate (metal content 6%) was used. The added amount of the charge imparting agent was set so that the mineral spirit solution of zirconium naphthenate becomes 3 parts by mass relative to 97 parts by mass of the perovskite material in the perovskite material dispersion liquid. Power conversion efficiency of perovskite photovoltaics fabricated in this manner was 6.4% being an average value of three samples. This value was of course high as compared to Example 1, and was a value much higher than that of Example 7 with no charge imparting agent added to the perovskite material dispersion liquid. At the time of the electrodeposition process, a voltage was applied so that the first electrode 24 became a negative electrode, to thereby electrodeposit the perovskite crystal particles 3 onto the first electrode 24 side. That is, it is inferred that due to addition of the charge imparting agent, the perovskite crystal particles 3 are positively charged.

Example 9

Fabrication and evaluation of a perovskite photovoltaic cell were performed in the same manner as in Example 8 except for the packing process of the perovskite layer. To the packing process, similarly to Example 2, the solvent vapor exposure was applied. Power conversion efficiency of perovskite photovoltaics fabricated in this manner was 6.9% being an average value of three samples. A power conversion efficiency improved ratio of Example 9 to Comparative example 2 was 1.17. This value was an improved ratio much higher than that by the coating film forming using the perovskite material dispersion liquid explained in Example 2 and Comparative example 2.

Example 10

Fabrication and evaluation of a perovskite photovoltaic cell were performed in the same manner as in Example 8 except for the packing process of the perovskite layer. To the packing process, similarly to Example 3, the pressurizing was applied. Power conversion efficiency of perovskite photovoltaics fabricated in this manner was 7.1% being an average value of three samples. A power conversion efficiency improved ratio of Example 10 to Comparative example 3 was 1.20. This value was an improved ratio much higher than that by the coating film forming using the perovskite material dispersion liquid explained in Example 3 and Comparative example 3.

Example 11

Fabrication and evaluation of a perovskite photovoltaic cell were performed in the same manner as in Example 8 except for the packing process of the perovskite layer. For the packing process, similarly to Example 4, the solvent vapor exposure, the heating, and the pressurizing were used in combination. Power conversion efficiency of perovskite photovoltaics fabricated in this manner was 7.4% being an average value of three samples. A power conversion efficiency improved ratio of Example 11 to Comparative example 4 was 1.20. This value was an improved ratio much higher than that by the coating film forming using the perovskite material dispersion liquid explained in Example 4 and Comparative example 4.

Example 12

Figure 15:
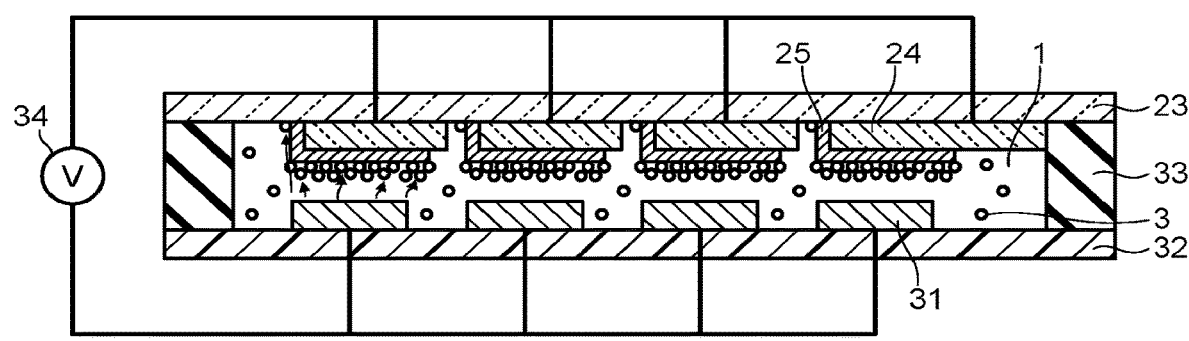
FIG. 15 is a view illustrating a producing apparatus of a photoelectric conversion film used in Example 12.

Fabrication and evaluation of a perovskite photovoltaic module were performed in the same manner as in Example 11 except that the device type was changed to a series module from a cell and with this change, the electrodeposition method of the perovskite crystal layer was changed. First, to the PEDOT•PSS layer being the first intermediate layer, similarly to Example 6, the pattern film forming by meniscus coating was applied. For the electrodeposition of the perovskite crystal layer, such a pattern electrodeposition process as illustrated in FIG. 15 was used. The supporting substrate 23 with electrodes (24) having had the first intermediate layers 25 film formed thereon and the base for electrodeposition 32 having the counter electrodes for electrodeposition 31 thereon were faced to each other with the spacer 33 disposed therebetween. At this time, sizes and positional relations of the first electrodes 24 and the counter electrodes for electrodeposition 31 are set appropriately, thereby making it possible to prevent the perovskite crystal particles 3 from being electrodeposited onto part of each of the first electrodes 24, namely to expose part of each of the first electrodes 24 or each of the first intermediate layers 25, so that it is possible connect a plurality of cells in series.

Power conversion efficiency of perovskite photovoltaics fabricated in this manner was 5.7% being an average value of three samples. This value was of course high as compared to Comparative example 6, and was a value much higher than that of Example 6 in which the perovskite material dispersion liquid was film formed by coating. After the electrodeposition process, in the same manner as explained in Example 7, the base for electrodeposition 32 was removed and natural dying was performed. On this occasion, the voltage application and the removal of the base for electrodeposition 32 are preferably performed in a state where the supporting substrate 23 is positioned above and the base for electrodeposition 32 is positioned below as illustrated in FIG. 15 so as to prevent the redundant perovskite crystal particles 3 that are not electrodeposited from adhering to the supporting substrate 23.

Example 13

Fabrication and evaluation of a perovskite photovoltaic module were performed in the same manner as in Example 12 except that the pattern film forming of the perovskite crystal layer was changed to an electrophotographic system in the atmosphere and the packing process was performed in the atmosphere. The perovskite crystal layer was pattern film formed using the film forming apparatus 111 illustrated in FIG. 11. For the photoconductor, an amorphous silicon photoconductor was used. For the corona charger, a positive charging type was used, and was set so as to make a surface potential of the photoconductor become 900 V. For the exposure device, a laser system was used, and was set so as to make a surface potential of a photoconductor of a exposure portion become 100 V. The gap between the electrodeposition roller and the photoconductor was set to 0.5 mm, and the voltage to be applied to the electrodeposition roller was set to 600 V. The voltage to be applied to the transfer bias roller was set to −800 V.

The perovskite crystal particles transferred onto the substrate with electrode were dried by a blower. Subsequently, a container having had DMF put thereinto was heated to 60° C. to generate vapor, and immediately above the container, the supporting substrate having the perovskite crystal layer was passed by, thereby being exposed to the good solvent vapor. Subsequently, by pressing the heated elastic rollers against the supporting substrate, heating and pressurizing were performed. The temperature and the pressure were set to 90° C. and a pressure to be about 30 kg weight per 1 cm² area of the substrate respectively. Power conversion efficiency of perovskite photovoltaics fabricated in this manner was 4.5% being an average value of three samples, and it was confirmed that Example 13 operates sufficiently as photovoltaics.

Example 14

Fabrication and evaluation of a perovskite photovoltaic module were performed in the same manner as in Example 13 except that the shape of the module was set to the irregular shape illustrated in FIG. 13. The irregular-shaped series module illustrated in FIG. 13 is one fabricated in the motif of a photovoltaic module intended for wrist watch and is one in which four sector-shaped cells are connected in series. Power conversion efficiency of perovskite photovoltaics fabricated in this manner was 5.1% being an average value of three samples, and it was confirmed that Example 14 operates sufficiently as photovoltaics. The pattern film forming of an irregular shape such as a sector shape is difficult to be performed by such a film forming method as the meniscus coating method. The electrophotographic system also suits the irregular-shaped pattern film forming.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

What is claimed is:

1. A producing method of a photoelectric conversion film, comprising:
    forming a photoelectric conversion film containing perovskite crystal particles on a film forming object by causing a photoelectric conversion material dispersion liquid to adhere on the film forming object and pressurizing the photoelectric conversion film to perform a packing process in a film thickness direction and obtain the photoelectric conversion film having a thickness of 10 nm or more and 1000 nm or less,
    wherein the photoelectric conversion material dispersion liquid contains: perovskite materials which exist as crystal particles, and have a composition represented by a composition formula: $ABX_3$, wherein A is a monovalent cation of an amine compound, B is a divalent cation of a metal element, and X is a monovalent anion of a halogen element, and have an average particle diameter of 10 nm or more and 300 nm or less; and a dispersion medium which is composed of a poor solvent to the perovskite materials, and in which the crystal particles of the perovskite materials are dispersed in the poor solvent and are not dissolved in the poor solvent.

2. The producing method of claim 1, further comprising:
    at least one of exposing the photoelectric conversion film to a good solvent of the perovskite crystal particles, and heating the photoelectric conversion film.

3. The producing method of claim 1,
    wherein the film forming includes:
        disposing a coating head above the film forming object;
        forming a meniscus column of the photoelectric conversion material dispersion liquid between the film forming object and the coating head; and moving at least one of the film forming object and the coating head to apply the photoelectric conversion material dispersion liquid on the film forming object from the meniscus column.

4. The producing method of claim 1,
wherein the film forming includes:
supplying the photoelectric conversion material dispersion liquid between the film forming object and a counter electrode for electrodeposition; and
applying a voltage to the film forming object and the counter electrode to electrodeposit the perovskite crystal particles in the photoelectric conversion material dispersion liquid onto the film forming object.

5. The producing method of claim 1,
wherein the film forming includes:
forming an electrostatic pattern on an electrostatic pattern support body;
supplying the photoelectric conversion material dispersion liquid on the electrostatic pattern support body to form a pattern of the perovskite crystal particles according to the electrostatic pattern; and
transferring the pattern of the perovskite crystal particles onto the film forming object.

6. The producing method of claim 1,
wherein the photoelectric conversion material dispersion liquid further contains a charge imparting agent which is not included in the composition of $ABX_3$, and which adheres to the perovskite materials which exist as the crystal particles.

7. The producing method of claim 6,
wherein the charge imparting agent comprises a compound containing at least one organic acid selected from the group consisting of a naphthenic acid, an oleic acid, an octylic acid, a sulfonic acid, a dodecyl acid, a dodecylbenzenesulfonic acid, and 2-ethylhexanoic acid, and at least one metal selected from the group consisting of zirconium, cobalt, copper, nickel, iron, zinc, lanthanum, gadolinium, sodium, and calcium.

8. The producing method of claim 1, further comprising preparing the photoelectric conversion material dispersion liquid, including:
preparing raw materials of the perovskite materials;
preparing a first liquid composed of the poor solvent and a second liquid composed of a solvent which has a solubility of the perovskite materials higher than a solubility of the first liquid and has a vapor pressure higher than a vapor pressure of the first liquid;
dissolving the raw materials in the second liquid to fabricate a first mixed solution;
mixing the first mixed solution and the first liquid together to fabricate a second mixed solution; and
evaporating the second liquid from the second mixed solution and crystallizing the raw materials dissolved in the second liquid to generate the perovskite materials which exist as the crystal particles, to obtain the photoelectric conversion material dispersion liquid having the perovskite materials dispersed in the first liquid.

9. A producing method of a photoelectric conversion device, comprising:
forming a first electrode on a substrate;
forming a photoelectric conversion film containing perovskite crystal particles on the first electrode by causing a photoelectric conversion material dispersion liquid to adhere on the first electrode and pressurizing the photoelectric conversion film to perform a packing process in a film thickness direction and obtain the photoelectric conversion film having a thickness of 10 nm or more and 1000 nm or less; and
forming a second electrode on the photoelectric conversion film,
wherein the photoelectric conversion material dispersion liquid contains: perovskite materials which exist as crystal particles, and have a composition represented by a composition formula: $ABX_3$, wherein A is a monovalent cation of an amine compound, B is a divalent cation of a metal element, and X is a monovalent anion of a halogen element, and have an average particle diameter of 10 nm or more and 300 nm or less; and a dispersion medium which is composed of a poor solvent to the perovskite materials, and in which the crystal particles of the perovskite materials are dispersed in the poor solvent and are not dissolved in the poor solvent.

10. The producing method of claim 9,
wherein the photoelectric conversion film forming further comprises at least one of exposing the photoelectric conversion film to a good solvent of the perovskite crystal particles, and heating the photoelectric conversion film.

11. The producing method of claim 9,
wherein the photoelectric conversion material dispersion liquid further contains a charge imparting agent which is not included in the composition of $ABX_3$, and which adheres to the perovskite materials which exist as the crystal particles.

12. The producing method of claim 11,
wherein the charge imparting agent comprises a compound containing at least one organic acid selected from the group consisting of a naphthenic acid, an oleic acid, an octylic acid, a sulfonic acid, a dodecyl acid, a dodecylbenzenesulfonic acid, and 2-ethylhexanoic acid, and at least one metal selected from the group consisting of zirconium, cobalt, copper, nickel, iron, zinc, lanthanum, gadolinium, sodium, and calcium.

13. The producing method of claim 9,
wherein the photoelectric conversion film forming further comprises preparing the photoelectric conversion material dispersion liquid, including:
preparing raw materials of the perovskite materials;
preparing a first liquid composed of the poor solvent and a second liquid composed of a solvent which has a solubility of the perovskite materials higher than a solubility of the first liquid and has a vapor pressure higher than a vapor pressure of the first liquid;
dissolving the raw materials in the second liquid to fabricate a first mixed solution;
mixing the first mixed solution and the first liquid together to fabricate a second mixed solution; and
evaporating the second liquid from the second mixed solution and crystallizing the raw materials dissolved in the second liquid to generate the perovskite materials which exist as crystal particles, to obtain the photoelectric conversion material dispersion liquid having the perovskite materials dispersed in the first liquid.

* * * * *